United States Patent
Huang et al.

(10) Patent No.: US 12,114,507 B2
(45) Date of Patent: *Oct. 8, 2024

(54) CAPPING LAYER OVER FET FeRAM TO INCREASE CHARGE MOBILITY

(71) Applicant: Taiwan Semiconductor Manufacturing Company, Ltd., Hsinchu (TW)

(72) Inventors: Rainer Yen-Chieh Huang, Changhua County (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/335,167

(22) Filed: Jun. 15, 2023

(65) Prior Publication Data

US 2023/0329000 A1 Oct. 12, 2023

Related U.S. Application Data

(63) Continuation of application No. 17/168,361, filed on Feb. 5, 2021, now Pat. No. 11,729,990.

(51) Int. Cl.
*H10B 51/30* (2023.01)
*H01L 21/28* (2006.01)
(Continued)

(52) U.S. Cl.
CPC ........ *H10B 51/30* (2023.02); *H01L 23/5226* (2013.01); *H01L 29/40111* (2019.08);
(Continued)

(58) Field of Classification Search
CPC ... H10B 51/30; H01L 29/516; H01L 29/6684; H01L 29/78391; H01L 29/40111
See application file for complete search history.

(56) References Cited

U.S. PATENT DOCUMENTS 11,729,990 B2 * 8/2023 Huang ............. H01L 29/78648
257/295
2006/0183274 A1 8/2006 Carcia et al.
(Continued)

OTHER PUBLICATIONS

Beneq. "How ALD Works." The date of publication is unknown. Retrieved online on Dec. 11, 2020 from https://beneq.com/en/technology/ald/.
(Continued)

*Primary Examiner* — Jose R Diaz
(74) *Attorney, Agent, or Firm* — Eschweiler & Potashnik, LLC

(57) ABSTRACT

In some embodiments, the present disclosure relates to an integrated chip that includes a gate electrode over a substrate, and a gate dielectric layer arranged over the gate electrode. The gate dielectric layer includes a ferroelectric material. An active structure is arranged over the gate dielectric layer and includes a semiconductor material. A source contact and a drain contact are arranged over the active structure. A capping structure is arranged between the source and drain contacts and over the active structure. The capping structure includes a first metal material.

20 Claims, 16 Drawing Sheets

(51) Int. Cl.
| | |
|---|---|
| *H01L 23/522* | (2006.01) |
| *H01L 29/51* | (2006.01) |
| *H01L 29/66* | (2006.01) |
| *H01L 29/78* | (2006.01) |
| *H01L 29/786* | (2006.01) |
| *H10B 51/00* | (2023.01) |

(52) U.S. Cl.
CPC ...... *H01L 29/516* (2013.01); *H01L 29/66765* (2013.01); *H01L 29/6684* (2013.01); *H01L 29/78391* (2014.09); *H01L 29/78648* (2013.01); *H01L 29/78669* (2013.01); *H01L 29/78678* (2013.01); *H01L 29/78687* (2013.01); *H01L 29/7869* (2013.01); *H01L 29/78693* (2013.01); *H10B 51/00* (2023.02)

(56) References Cited

U.S. PATENT DOCUMENTS

| | | | |
|---|---|---|---|
| 2018/0012739 | A1 | 1/2018 | Yamazaki et al. |
| 2020/0098926 | A1 | 3/2020 | Sharma et al. |

OTHER PUBLICATIONS

Kahraman, Aysegul. "Understanding of post deposition annealing and substrate temperature effects on structural and electrical properties of Gd2O3 MOS capacitor." Journal of Materials Science: Materials in Electronics vol. 29, pp. 7993-8001(2018), published on Feb. 22, 2018.
Sundqvist, Jonas "Entegris launch Fluorine-Free Tungsten (FFW) for 3D NAND." BALD Engineering, published on Aug. 27, 2016.
McCormick, Abraham. "Thin Film System TFS 500. Advanced tool for advanced ALD research." Published, Dec. 2007.
Wikipedia.org. "Atomic layer deposition." Published on Nov. 29, 2020.
Wikipedia.org "Fe FET" Published on Nov. 28, 2020.
Wikipedia.org. "Indium gallium zinc oxide" Published on Sep. 21, 2020.
Onaya et al. "Improvement in ferroelectricity of HfxZr1-xO2 Thin Films Using Top and Bottom ZrO2 Nucleation Layers." APL Mater. 7, 061107 (2019); doi: 10.1063/1.5096626, published on Jun. 27, 2019.
Onaya et al. "Improvement in Ferroelectricity of HfxZr1%xO2 Thin Films Using ZrO2 Seed Layer." Applied Physics Express 10, 081501 (2017), published on Jul. 13, 2017.
Robertson, J. "Band structures and band offsets of high K dielectrics on Si" Applied Surface Science 190 !2002) 2±10, published in 2002.
Hays et al. "Energy band offsets of dielectrics on InGaZnO4" Applied Physics Reviews 4, 021301 (2017), published on Apr. 18, 2017.
Hays et al. "Band offsets in HfSiO4/IGZO heterojunctions" J. Vac. Sci. Technol. B 33(6), Nov./Dec. 2015, published on Nov. 19, 2015.
Hays et al. "Effect of deposition conditions and composition on band offsets in atomic layer deposited HfxSi1-xOy on InGaZnO4" J. Vac. Sci. Technol. B 35(1), Jan./Feb. 2017, published on Jan. 11, 2017.
Materlik et al. "The Origin of Ferroelectricity in HfxZr1-xO2: A Computational Investigation and a Surface Energy Model" Journal of Applied Physics 117, 134109 (2015), published on Apr. 7, 2015.
Dogan et al. "Causes of ferroelectricity in HfO2-based thin films: An ab initio perspective" Physical Chemistry Chemical Physics • May 2019, published on May 29, 2019.
Estandia et al. "Engineering Ferroelectric Hf0.5Zr0.5O2 Thin Films by Epitaxial Stress" ACS Applied Electronic Materials, 1, 1449 (2019), published on Jul. 3, 2019.
Huang et al. "Performance tuning of InGaZnO thin-film transistors with a SnInGaZnO electron barrier layer." Applied Physics Letters 102, 092108 (2013), published on Mar. 8, 2013.
Takechi et al. "Depth-profiling XPS analysis of He-plasma treated amorphous InGaZnO thin films for use in top-gate coplanar thin-film transistors" Japanese Journal of Applied Physics 58, 038005 (2019), published on Feb. 11, 2019.
U.S. Appl. No. 17/168,342, filed Feb. 5, 2021.
U.S. Appl. No. 17/319,461, filed May 13, 2021.
Zan et al. "Achieving High Field-Effect Mobility in Amorphous Indium-Gallium-Zinc Oxide by Capping a Strong Reduction Layer." Adv. Mater. 2012, 24, 3509-3514, published on Jun. 8, 2012.
Hasegawa, Masakatsu. "Ellingham Diagram." Treatise on Process Metallurgy, vol. 1, published in 2014.
Kwon et al. "Recent Progress in High Performance and Reliable n-type Transition Metal Oxide-Based Thin Film Transistors." Semicond. Sci. Technol. 30 (2015) 024002 (16pp), published on Jan. 19, 2015.
Non-Final Office Action dated Aug. 22, 2022 for U.S. Appl. No. 17/168,361.
Notice of Allowance dated Mar. 22, 2023 for U.S. Appl. No. 17/168,361.

* cited by examiner

CAPPING LAYER OVER FET FeRAM TO INCREASE CHARGE MOBILITY

REFERENCE TO RELATED APPLICATION

This application is a Continuation of U.S. application Ser. No. 17/168,361, filed on Feb. 5, 2021, the contents of which are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic and thin film transistor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
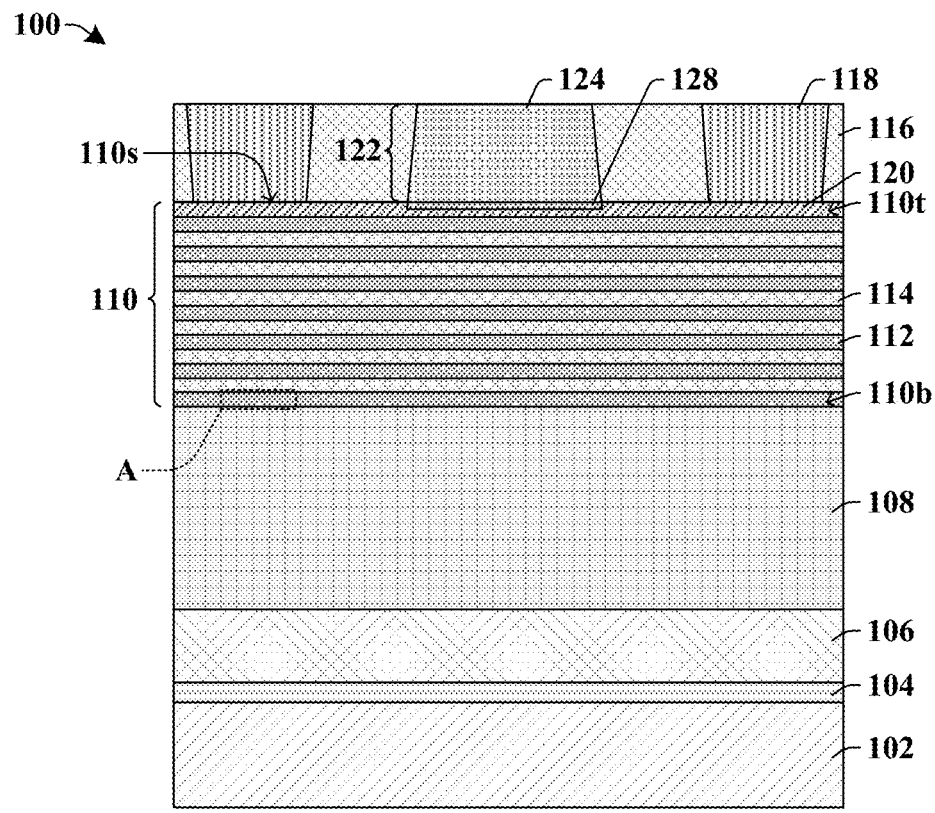
FIG. 1 illustrates a cross-sectional view of some embodiments of a field effect transistor (FET) ferroelectric random access memory (FeRAM) device comprising a capping structure arranged over an active structure, wherein a bottommost layer of the active structure comprises a cocktail layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A thin film transistor (TFT) is a type of field effect transistor (FET) that includes an active structure that may be turned "ON" such that mobile charge carriers flow through the active structure when a sufficient signal (e.g., voltage, current) is applied to source contact, drain contact, and gate electrode of the TFT. In some instances, the active structure comprises a semiconductor material that is transparent such as, for example, indium gallium zinc oxide (IGZO), amorphous silicon, or some other suitable material for use in optical applications. In a bottom gate TFT, the gate electrode is arranged below the active structure and the source and drain contacts are arranged over the active structure. A gate dielectric layer may separate the gate electrode from the active structure. In some instances, the gate dielectric layer comprises a ferroelectric material, such that the TFT functions as a FET ferroelectric random access memory (FeRAM). The ferroelectric layer can store data values based on a process of reversible switching between polarizations states because the ferroelectric's crystal structure changes when an electric field is present.

To form a FET FeRAM device, a ferroelectric layer is formed over a gate electrode. Then, an active structure is formed over the ferroelectric layer, and source and drain contacts are formed over the active structure. In some embodiments, depending on which materials of the active structure directly contact the gate dielectric layer, defects may be present at an interface the active structure and the gate dielectric layer such as, for example, oxygen vacancies and surface states (i.e., excess charges) which may reduce charge mobility in the active structure. Further, defects may form at a topmost surface of the active structure due to the topmost surface's exposure to air in the surrounding environment. Such defects at the topmost surface of the active structure may also include oxygen vacancies and surface states which increase electron scattering and reduce charge mobility.

Various embodiments of the present disclosure relate to forming a capping structure over the active structure and between source and drain contacts to reduce defects at the topmost surface of the active structure and increase charge mobility of the active structure thereby improving performance of the overall FET FeRAM device. In some such embodiments, a topmost layer of the active structure comprises a first metal oxide material having a high bonding energy which reduces oxygen vacancies at the topmost surface of the active structure. Further, the capping structure comprises, in some embodiments, one or more metal materials that have a strong ability to oxidize which reduces oxygen vacancies at the topmost surface of the active structure. Further, in some embodiments, a bottommost layer of the active structure may comprise a mixture of the first metal oxide material and a second metal oxide material such that the first and second metal oxide materials directly contact the ferroelectric layer to increase charge mobility and reduce surface states at an interface between the active structure and the ferroelectric layer. With a reduction in defects (e.g., oxygen vacancies, surface states, weakly bonded oxygen) in the active structure, the charge mobility in the active structure increases, which increases switching speeds and reliability of the FET FeRAM device.

FIG. 1 illustrates a cross-sectional view 100 of some embodiments of a field effect transistor (FET) ferroelectric random access memory (FeRAM) device comprising a capping structure arranged over an active structure.

The cross-sectional view 100 of FIG. 1 includes a gate electrode 106 arranged over a substrate 102. In some embodiments, a dielectric layer 104 is arranged between the gate electrode 106 and the substrate 102. In some embodiments, a gate dielectric layer 108 is arranged over the gate electrode 106. In such embodiments, the gate dielectric layer 108 comprises a ferroelectric material that is configured to store data states by changing crystal structure orientations and thus, resistances upon exposure to different voltage biases.

In some embodiments, an active structure 110 is arranged over the gate dielectric layer 108. In some embodiments, the active structure 110 comprises a semiconductor material that can be turned "ON" to form a channel region of mobile charge carriers when a sufficient voltage bias is applied across the active structure 110. The channel region of mobile charge carriers can be controlled to read data from or write data to the gate dielectric layer 108. In some embodiments, a bottommost layer 110b of the active structure 110 comprises a cocktail layer 112 comprising a mixture of first and second materials, and a first active layer 114 comprising a third material different than the first and second materials is arranged over the cocktail layer 112. In some embodiments, the active structure 110 comprises a stack of the cocktail layers 112 and the first active layers 114 in alternating order.

In some embodiments, source/drain contacts 118 are arranged over the active structure 110. In some embodiments, the source/drain contacts 118 are arranged within and extend through an interconnect dielectric layer 116 to contact the topmost layer 110t of the active structure 110.

In some embodiments, the first, second, and third materials of the active structure 110 are metal-oxides. In some embodiments, the third material of the first active layer 114 comprises a more crystalline material than the first and second materials. Thus, the first active layer 114 is spaced apart from the gate dielectric layer 108 because otherwise, an interface between the third material of the first active layer 114 and the gate dielectric layer 108 would be too rough and have potential adhesion and structural issues on the gate dielectric layer 108. In some embodiments, the first material of the cocktail layer 112 comprises a stronger or more negative bonding energy than the second material. In some embodiments, the bonding energy may be determined from a metal oxide Ellingham diagram, which illustrates the Gibbs free energy of formation versus temperature for various metal-oxides.

Because the first material has a stronger bonding energy, less defects (e.g., oxygen vacancies) and thus, less surface states (i.e., excess charges) are present at an interface between the first material of the cocktail layer 112 and the gate dielectric layer 108. In some embodiments, the second material of the cocktail layer 112 has a higher mobility than the first material of the cocktail layer 112 due to a weaker bond energy and an increase in metal ions in the second material. Thus, mobile charge carriers may have a higher mobility at an interface between the second material of the cocktail layer 112 and the gate dielectric layer 108. For these reasons, in some embodiments, the cocktail layer 112 comprises a mixture of the first and second materials to reduce defects but also increase charge mobility at an interface between the bottommost layer 110b of the active structure 110 and the gate dielectric layer 108 to increase the reliability and switching speeds of the FET FeRAM device.

In some embodiments, a topmost layer 110t of the active structure 110 comprises a second active layer 120 comprising the first material and not the second or third materials because of the high bonding energy of the first material. In some such embodiments, the high bonding energy of the first material reduces defects such as oxygen vacancies at a topmost surface 110s of the active structure 110. In some embodiments, the topmost layer 110t of the active structure 110 is arranged directly on one of the cocktail layers 112. Further, a capping structure 122 is arranged over the active structure 110 and between the source/drain contacts 118 to reduce defects (e.g., surface states, oxygen vacancies) at the topmost surface 110s of the active structure 110. In some embodiments, the capping structure 122 extends through the interconnect dielectric layer 116 to contact the active structure 110.

In some embodiments, the capping structure 122 comprises a first metal layer 124 comprising a first metal material. In some embodiments, the first metal material of the first metal layer 124 comprises one or more metals that has a strong oxidation ability. In other words, the first metal material has a high affinity for oxygen. In some embodiments, the affinity for oxygen may be determined from a metal oxide Ellingham diagram, which illustrates the Gibbs free energy of formation versus temperature for various metal oxides; a metal oxide with a more negative Gibbs free energy indicates that the metal has a higher affinity for oxygen. In some embodiments, the Gibbs free energy may be measured by x-ray photoluminescence spectra, x-ray fluorescence, photoluminescence, or some other suitable measuring technique.

In some embodiments, the first metal layer 124 has a higher affinity for oxygen, or a more negative Gibbs free energy on an Ellingham diagram, than the metal-oxide materials of the active structure 110. Thus, when the first metal layer 124 is formed directly on the topmost layer 110t of the active structure 110, the first metal material may diffuse into the active structure 110 and bond with weakly bonded oxygen of the active structure 110 to reduce defects (e.g., oxygen vacancies, surface states, weakly bonded oxygen) in the active structure 110 and increase charge mobility in the active structure 110. In some such embodiments, a diffusion region 128 may be arranged in an upper area of the active structure 110 and below the first metal layer 124 of the capping structure 122 that comprises the first metal material bonded with oxygen.

Therefore, in some embodiments, the capping structure 122 reduces defects (e.g., oxygen vacancies, surface states, weakly bonded oxygen) near the topmost surface 110s of the active structure 110 to increase charge mobility of the active structure 110 thereby increasing switching speeds of the overall FET FeRAM device. With an increase in switching speeds, the FET FeRAM device may be turned "ON"

quicker because mobile charge carriers may move through the active structure easier. As a result, data may be stored onto or read from the gate dielectric layer 108 more easily and reliably.

Figure 2:
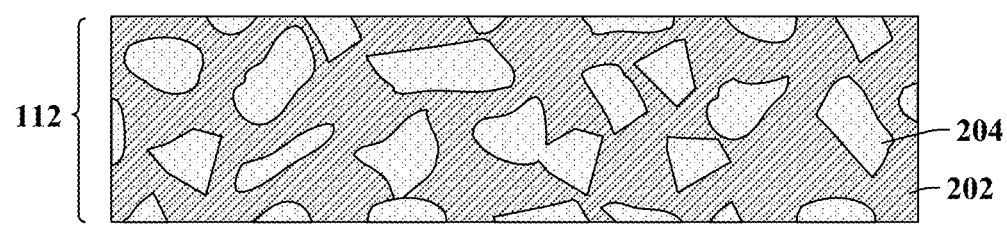
FIG. 2 illustrates a magnified, cross-sectional view of some embodiments of the microstructure of the cocktail layer.

FIG. 2 illustrates a magnified, cross-sectional view 200 of some embodiments of the microstructure of the cocktail layer. In some embodiments, the cross-sectional view 200 corresponds to box A of FIG. 1.

As shown in cross-sectional view 200, in some embodiments, the cocktail layer 112 comprises first material regions 202 and second material regions 204. In some embodiments, the second material regions 204 appear to be embedded within the first material regions 202. In other embodiments, the first material regions 202 may appear to be embedded within the second material regions 204. Nevertheless, in some embodiments, the cocktail layer 112 includes a mixture of the first and second materials, and the magnified, cross-sectional view 200 may exhibit defined first material regions 202 comprising the first material and second material regions 204 comprising the second material.

In some embodiments, the first material comprises gallium oxide, hafnium oxide, zirconium oxide, titanium oxide, aluminum oxide, tantalum oxide, strontium oxide, barium oxide, scandium oxide, magnesium oxide, lanthanum oxide, gadolinium oxide, or some other suitable metal oxide. In some embodiments, the second material comprises indium oxide, tin oxide, arsenic oxide, zinc oxide, or the like. In some embodiments, the third material comprises zinc oxide. Thus, for example, in some embodiments, the first material comprises gallium oxide; the second material comprises indium oxide; and the third material comprises zinc oxide, such that the active structure (110 of FIG. 1) comprises indium gallium zinc oxide (IGZO), which is a semiconducting material. In some other embodiments, the active structure (110 of FIG. 1) may comprise tin gallium zinc oxide, indium hafnium zinc oxide, or some other suitable combination of the first, second, and third materials that together form a semiconducting material.

In some such embodiments, the first material regions 202 are substantially amorphous, and the second material regions 204 are substantially amorphous. With the first and second material regions 202, 204 being amorphous, roughness and electron scattering are reduced at the interface between the cocktail layer 112 and the gate dielectric layer (108 of FIG. 1). Further in some embodiments, because the first material regions 202 and the second material regions 204 directly contact the gate dielectric layer (108 of FIG. 1), defects are reduced and charge mobility is increased which increases the "ON" current and the switching speeds of the FET FeRAM device.

Figure 3:
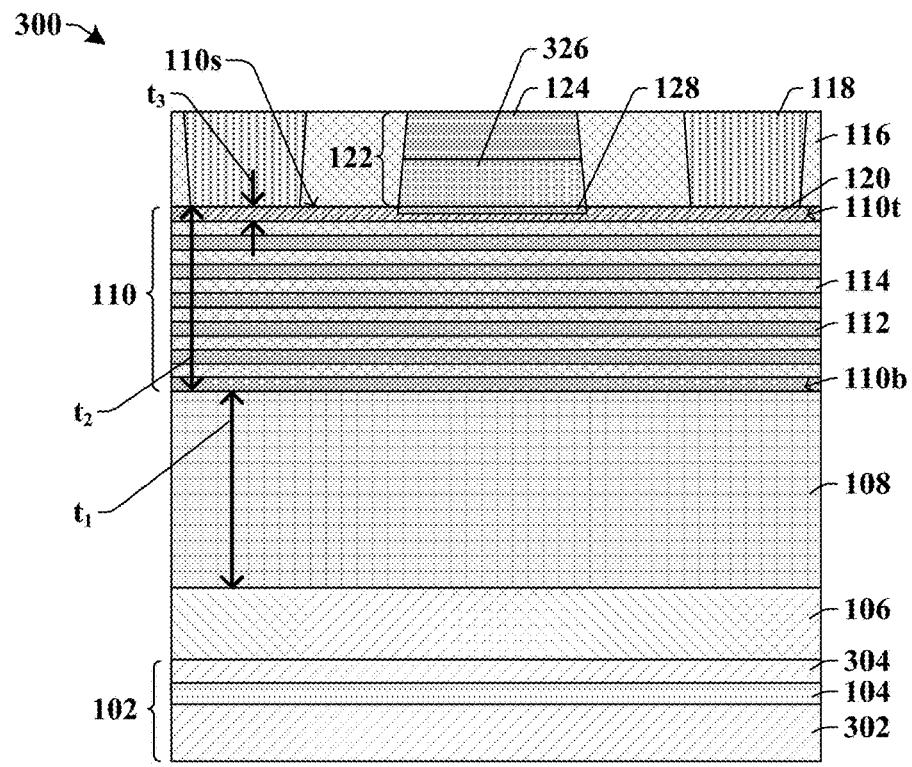
FIG. 3 illustrates a cross-sectional view of some alternative embodiments of a FET FeRAM device comprising a capping structure arranged over an active structure, wherein a bottommost layer of the active structure comprises a cocktail layer.

FIG. 3 illustrates a cross-sectional view 300 of some alternative embodiments of a FET FeRAM device comprising a capping structure over an active structure.

In some embodiments, the substrate 102 comprises a silicon on insulator substrate such that the dielectric layer 104 is arranged between a bulk substrate layer 302 and an active substrate layer 304. In some embodiments, the topmost layer 110t of the active structure 110 is arranged directly on one of the first active layers 114. It will be appreciated that the active structure 110 may comprise more or less layers than what is illustrated in FIG. 3A.

In some embodiments, the gate dielectric layer 108 has a first thickness $t_1$ in a range of between, for example, approximately 5 nanometers and approximately 20 nanometers. In some embodiments, the active structure 110 may have a second thickness $t_2$ in a range of between, for example, approximately 5 nanometers and approximately 15 nanometers. In some embodiments, each cocktail layer 112, first active layer 114, and/or second active layer 120 has a third thickness $t_3$ in a range of between, for example, approximately 0.1 angstroms to approximately 500 angstroms. In some embodiments, a ratio of the first material to the second material ranges from approximately 0.1 to approximately 0.99 in the cocktail layer 112.

In some embodiments, the gate electrode 106 may comprise, for example, titanium nitride, aluminum, tungsten, copper, or some other suitable conductive material. In some embodiments, the gate dielectric layer 108 comprises a ferroelectric material such as, for example, strontium bismuth tantalite, lead zirconate titanate, hafnium zinc oxide, hafnium zirconium oxide, doped hafnium oxide, or the like. In some embodiments, the gate electrode 106 may have a thickness in a range of between, for example, approximately 10 nanometers and approximately 20 nanometers. In some embodiments, the source/drain contacts 118 may comprise, for example, aluminum, tungsten, copper, tantalum, titanium, or some other suitable conductive material.

Further, in some embodiments, the capping structure 122 comprises aluminum, calcium, scandium, yttrium, niobium, tantalum, chromium, iron, titanium, silicon, hafnium, zirconium, titanium, strontium, barium, magnesium, lanthanum, gadolinium, a combination thereof, and/or some other suitable metal or semiconductor material with a strong oxidation ability (i.e., a high affinity for oxygen). In some embodiments, the capping structure 122 has a thickness in a range of between, for example, approximately 0.1 angstroms to approximately 30 angstroms. In some embodiments, the capping structure 122 further comprises a second metal layer 326 comprising a second metal material that is different than the first metal material of the first metal layer 124. For example, in some embodiments, the first metal layer 124 may comprise calcium, and the second metal layer 326 may comprise aluminum. In some such embodiments, the diffusion region 128 of the active structure 110 may comprise calcium oxide. In some embodiments, the first metal layer 124 is a single layer formed by atomic layer deposition (ALD). In some other embodiments, the first metal layer 124 comprises multiple layers of a same material formed by ALD. In some embodiments, the second metal layer 326 is a single layer formed by atomic layer deposition (ALD). In some other embodiments, the second metal layer 326 comprises multiple layers of a same material formed by ALD. Nevertheless, in some embodiments, the capping structure 122 comprises one or more metal materials arranged as layers and/or as alloys that directly contact the topmost surface 110s of the active structure 110 to reduce defects (e.g., oxygen vacancies, surface states, weakly bonded oxygen) of the active structure 110 and improve performance of the FET FeRAM device.

Figure 4:
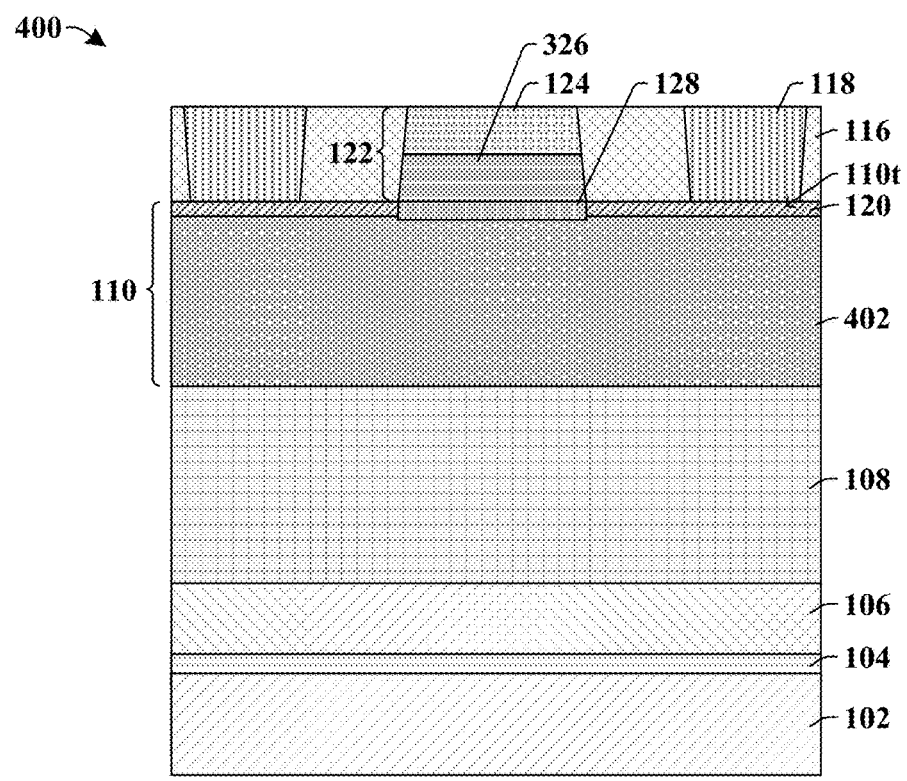
FIGS. 4 and 5 illustrate cross-sectional views of some embodiments of FET FeRAM devices comprising capping structures arranged over active structures.

FIG. 4 illustrates a cross-sectional view 400 of some other embodiments of a FET FeRAM device comprising a capping structure over an active structure.

In some embodiments, the active structure 110 comprises a mixture of the first, second, and third materials over the substrate 102. Thus, in some embodiments, the active structure 110 comprises a lower portion 402 that does not have defined layers. In some other embodiments, the lower portion 402 may comprise a single semiconductor material such as silicon, for example. In some embodiments, the second active layer 120 is arranged directly on the lower portion 402 of the active structure 110 and comprises the first material. In some embodiments, the lower portion 402 is arranged directly on the gate dielectric layer 108. In yet some other embodiments, the cocktail layer (112 of FIG. 1) may be arranged directly between the lower portion 402 of the active structure 110 and the gate dielectric layer 108.

In some embodiments, the diffusion region 128 of the active structure 110 extends below the topmost layer 110t of the active structure 110. In some other embodiments, the diffusion region 128 extends into the topmost layer 110t of the active structure 110 but does not extend below the topmost layer 110t of the active structure 110 (see, e.g., FIG. 3).

Further, in some embodiments, a topmost surface of the capping structure 122 is narrower than a bottommost surface of the capping structure 122. In some such embodiments, the capping structure 122 may be formed through a deposition process followed by a patterning process, prior to forming the interconnect dielectric layer 116.

Figure 5:
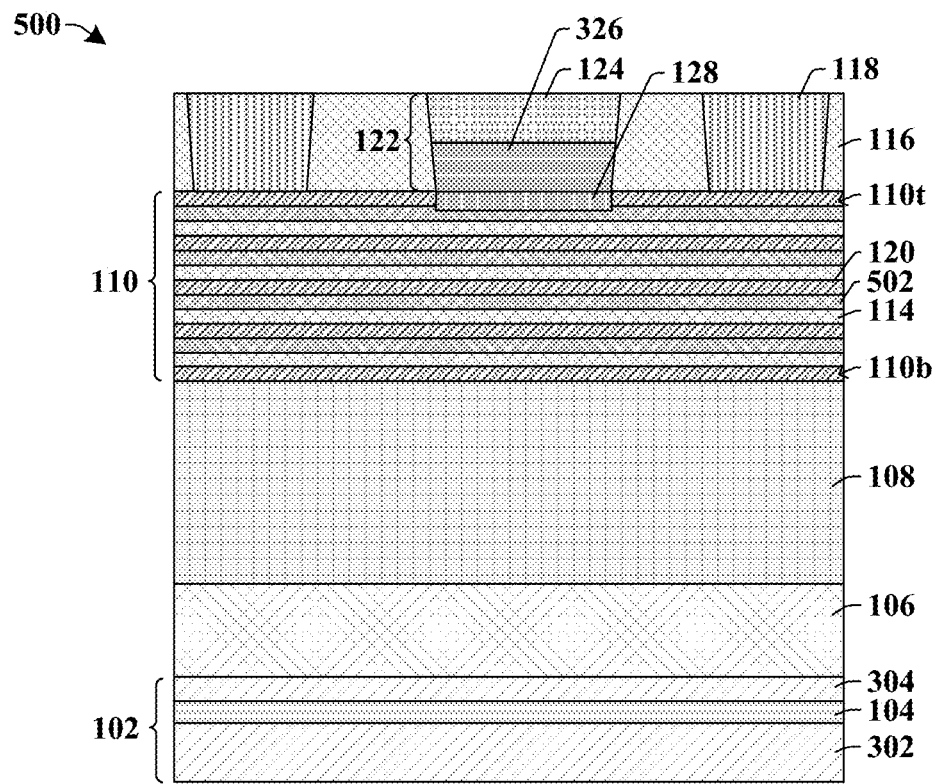

FIG. 5 illustrates a cross-sectional view 500 of yet some other embodiments of a FET FeRAM device comprising a capping structure over an active structure.

In some embodiments, the active structure 110 comprises a stack of first active layers 114, second active layers 120, and third active layers 502 over the gate dielectric layer 108. In some such embodiments, the arrangement of the first, second, and third active layers 114, 120, 502 may be, for example, the first active layer 114 arranged over the second active layer 120, and the third active layer 502 arranged over the first active layer 114. It will be appreciated that a different sequence of the first, second, and third active layers 114, 120, 502 than what is shown in FIG. 5 is also within the scope of this disclosure.

In some embodiments, the first active layers 114 may comprise the third material, the second active layers 120 may comprise the first material, and the third active layers 502 may comprise the second material. In other words, in some embodiments, none of the layers of the active structure 110 comprise a mixture of metal oxides; instead each layer of the active structure 110 comprises a single metal oxide. In some other embodiments, a bottommost layer 110b of the active structure 110 may comprise the cocktail layer (112 of FIG. 1) to increase charge mobility at an interface between the active structure 110 and the gate dielectric layer 108.

In some embodiments, the topmost layer 110t of the active structure 110 comprises the second active layer 120 which comprises the first material. In some embodiments, the topmost layer 110t is arranged directly on one of the first active layers 114 or directly on one of the third active layers 502.

Further, in some embodiments, a topmost surface of the capping structure 122 is wider than a bottommost surface of the capping structure 122. In some such embodiments, the capping structure 122 may be formed through a patterning process followed by a deposition process after to form the interconnect dielectric layer 116.

Figure 6:
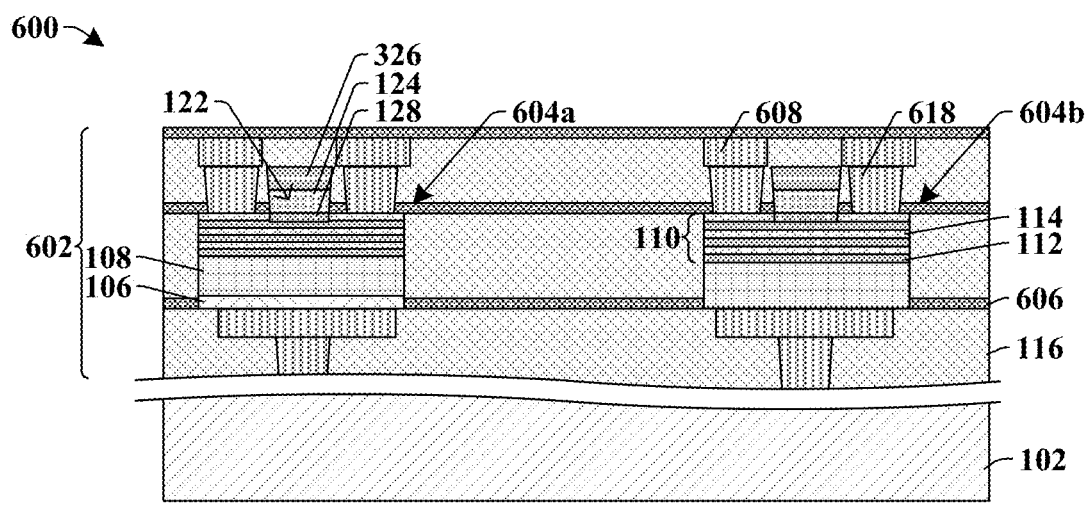
FIG. 6 illustrates a cross-sectional view of some embodiments of an integrated chip comprising a FET FeRAM device having a capping structure arranged over an active structure and embedded within an interconnect structure.

FIG. 6 illustrates a cross-sectional view 600 of some embodiments of an integrated chip comprising a FET FeRAM device embedded within an interconnect structure.

In some embodiments, the FET FeRAM device is arranged within an interconnect structure 602 that is arranged over the substrate 102. In some such embodiments, the FET FeRAM devices (e.g., 604a, 604b) are arranged within the back-end-of-line (BEOL) portion of the integrated chip, wherein the BEOL portion of the integrated chip is arranged over the front-end-of-line (FEOL) portion of the integrated chip. In some embodiments, the FET FeRAM devices (e.g., 604a, 604b) are electrically coupled to devices in the FEOL portion of the integrated chip. In some embodiments, the FEOL portion of the integrated chip comprises at least one transistor device arranged within and/or over the substrate 102 such as, for example, a metal-oxide-semiconductor field effect transistor (MOSFET), a fin field effect transistor (finFET), a gate all around field effect transistor (GAAFET), or some other type of transistor device.

In some embodiments, the interconnect structure 602 comprises interconnect contacts 618 and interconnect wires 608 disposed within interconnect dielectric layers 116 and etch stop layers 606. In some embodiments, the interconnect contacts 618 and the interconnect wires 608 may comprise, for example, aluminum, tungsten, copper, tantalum, titanium, or some other suitable conductive material. In some embodiments, the interconnect dielectric layers 116 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the etch stop layers 606 may comprise, for example, silicon carbide, silicon nitride, or some other suitable dielectric material.

As shown in FIG. 6, a first FET FeRAM 604a and a second FET FeRAM 604b arranged within the interconnect structure 602. In some embodiments, the interconnect contacts 618 are arranged over and coupled to the active structure 110 such that the interconnect contacts 618 serve as the source/drain contacts (118 of FIG. 5) of the FET FeRAM device. In some embodiments, as shown with the first FET FeRAM 604a, the gate electrode 106 is arranged over one of the interconnect wires 608. In other embodiments, the gate electrode 106 may be arranged over one of the interconnect contacts 618. In some embodiments, as shown with the second FET FeRAM 604b, the gate electrode 106 is omitted, and instead, the gate dielectric layer 108 is arranged directly on one of the interconnect wires 608 of the interconnect structure 602.

In some embodiments, the capping structure 122 is not directly coupled to one of the interconnect wires 608 or interconnect contacts 618. In some other embodiments, the capping structure 122 may be coupled to an interconnect wire 608 or an interconnect contact 618 to ground the capping structure 122. In some such other embodiments, grounding the capping structure 122 may improve the gate dielectric layer's 108 ability to switch between polarization states to store memory.

In some embodiments, due to the small vertical dimensions of the FET FeRAMs (e.g., 604, 604b), the FET FeRAMs may be integrated into the interconnect structure 602 of an integrated chip and controlled by the network of interconnect wires 608 and interconnect contacts 618 of the interconnect structure 602 to store data within the gate dielectric layers 108.

FIGS. 7-21 illustrate various schematics and cross-sectional views 700-2100 of some embodiments of a method of forming a FET FeRAM device comprising a capping structure arranged over an active structure to reduce defects in the active structure and increase switching speeds and reliability of the overall FET FeRAM device. Although FIGS. 7-21 are described in relation to a method, it will be appreciated that the structures disclosed in FIGS. 7-21 are not limited to such a method, but instead may stand alone as structures independent of the method.

Figure 7:
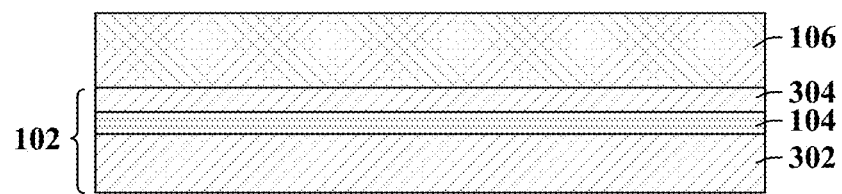
FIGS. 7-20 illustrate various views and schematics of some embodiments of methods of forming a capping structure over an active structure of a FET FeRAM device.

As shown in cross-sectional view 700 of FIG. 7, in some embodiments, a gate electrode 106 is formed over a substrate 102. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some other embodiments, the substrate 102 may comprise a support transparent material, such as a glass, for use in optical applications. In the cross-sectional view 700 of FIG. 7, the substrate 102 is a silicon-on-insulator (SOI) substrate comprising a dielectric layer 104 arranged over a bulk substrate layer 302 and arranged below an active substrate layer 304. In some such embodiments, the bulk substrate layer 302 and the active substrate layer 304 may comprise, for example, silicon, germanium, or some other suitable semiconductor material. In some embodiments, the dielectric layer 104 comprises silicon dioxide, silicon oxynitride, or some other suitable dielectric layer.

In some embodiments, the gate electrode 106 is formed over the substrate 102 by way of a deposition process (e.g., physical vapor deposition (PVD), chemical vapor deposition (CVD), atomic layer deposition (ALD), direct current sputtering, etc.). In some embodiments, the gate electrode 106 comprises titanium nitride, aluminum, tungsten, copper, or some other suitable conductive material. In some embodiments, the gate electrode 106 is formed to have a thickness in a range of between, for example, approximately 10 nanometers and approximately 20 nanometers.

Figure 8:
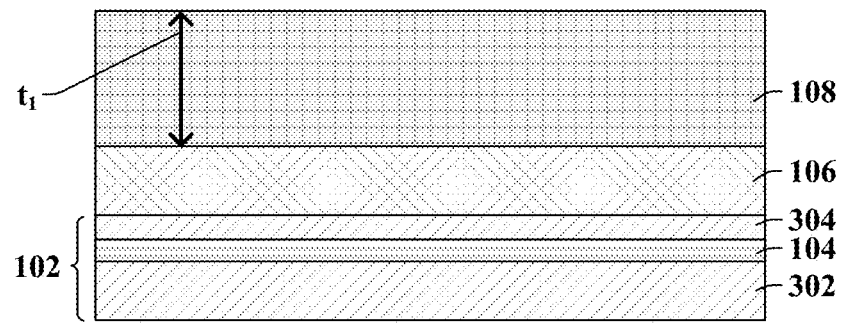

As shown in cross-sectional view 800 of FIG. 8, in some embodiments, a gate dielectric layer 108 is formed over the gate electrode 106. In some embodiments, the gate dielectric layer 108 is formed by atomic layer deposition in a chamber at a temperature in a range of between, for example, approximately 200 degrees Celsius and approximately 400 degrees Celsius. In some other embodiments, the gate dielectric layer 108 is formed by way of another deposition process (e.g., PVD, CVD, etc.). In some embodiments, the gate dielectric layer 108 comprises a ferroelectric material such as, for example, strontium bismuth tantalite, lead zirconate titanate, hafnium zinc oxide, hafnium zirconium oxide, doped hafnium oxide, or the like. For example, in some embodiments, the gate dielectric layer 108 comprises hafnium zirconium oxide, wherein an atomic ratio between hafnium and zirconium is approximately one to one. In some embodiments, the gate dielectric layer 108 has a first thickness $t_1$ that is in a range of between approximately 5 nanometers and approximately 20 nanometers.

Figure 9:
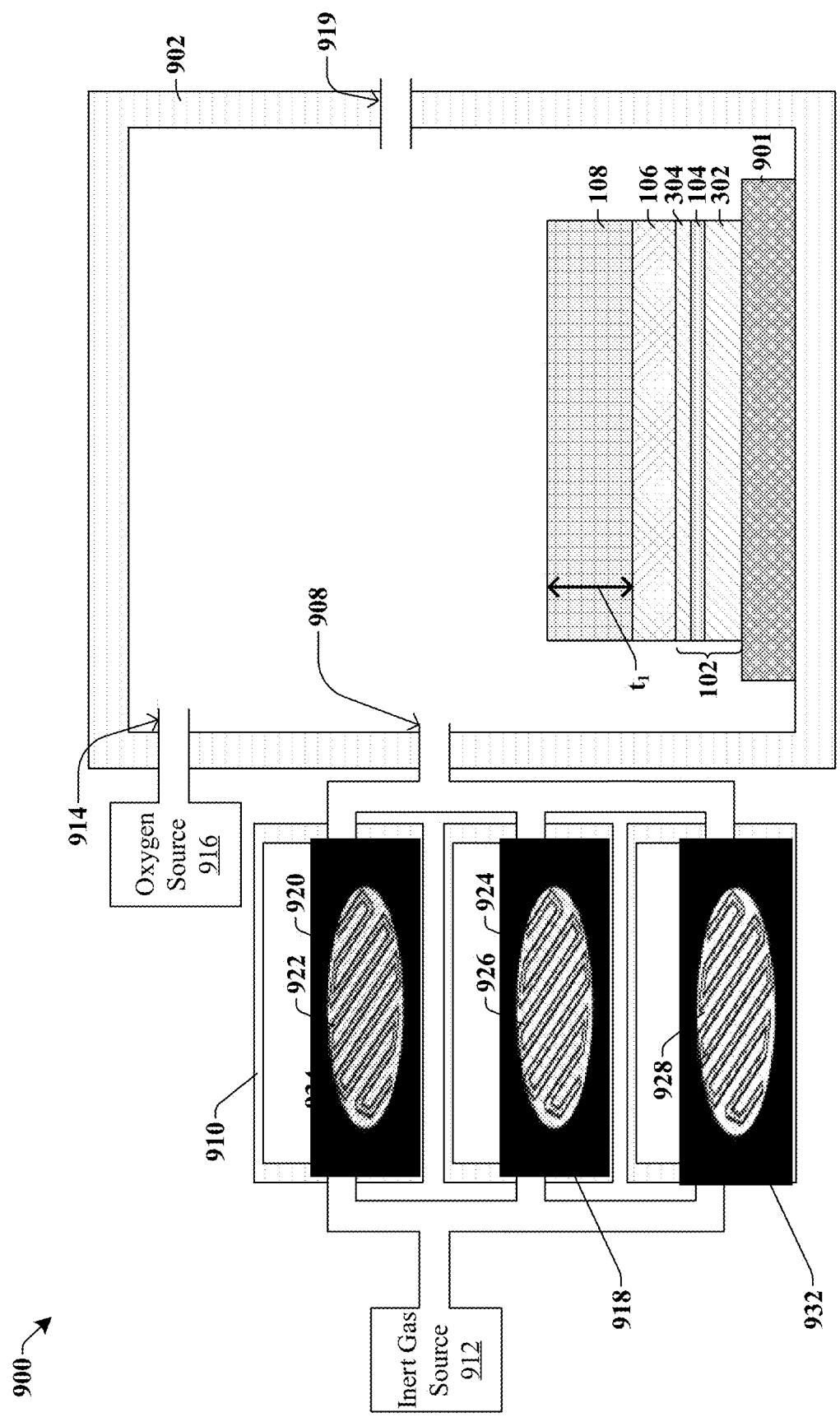

As shown in cross-sectional view 900 of FIG. 9, in some embodiments, the substrate 102 is transferred onto a wafer chuck 901 within a reaction chamber defined by chamber housing 902. In some embodiments, the reaction chamber is an atomic layer deposition (ALD) chamber, low pressure vessel, and/or the like. In some embodiments, the substrate 102 was already in the reaction chamber during the formation of the gate electrode 106 and/or gate dielectric layer 108 forming in FIGS. 7 and 8, respectively. In some embodiments, a first gas inlet line 908 passes through the chamber housing 902 such that precursor vessels defined by vessel housings (e.g., 910, 918, 932) are coupled to the reaction chamber through the first gas inlet line 908. In some embodiments, a second gas inlet line 914 passes through the chamber housing 902 such that an oxygen source 916 can enter the reaction chamber. In some embodiments, a gas outlet line 919 passes through the chamber housing 902 such that various gases can exit the reaction chamber during deposition processes.

In some embodiments, a first precursor vessel defined by a first vessel housing 910, a second precursor vessel defined by a second vessel housing 918, and a third precursor vessel defined by a third vessel housing 932 are coupled to the first gas inlet line 908 and to an inert gas source 912. In other embodiments, more or less than three precursor vessels may be coupled to the reaction chamber. In some embodiments, the inert gas source 912 may be turned "ON" such that inert gas enters one or more of the precursor vessels to activate precursors in each precursor vessel such that a precursor vapor enters the reaction chamber through the first gas inlet line 908 to form a layer on the gate dielectric layer 108. In some embodiments, each precursor vessel comprises door structures 936 that may be controlled by control circuitry to be opened or closed, as indicated by arrows 934, to respectively allow or prohibit the inert gas from the inert gas source 912 to enter the precursor vessel.

In some embodiments, the first precursor vessel comprises a first precursor plate 920 that holds a first solid precursor 922 within grooves of the first precursor plate 920. In some embodiments, the second precursor vessel comprises a second precursor plate 924 that holds a second solid precursor 926 within grooves of the second precursor plate 924. In some embodiments, the third precursor vessel comprises a third precursor plate 928 that holds a third solid precursor 930 within grooves of the third precursor plate 928. In some embodiments, the first, second, and third solid precursors 922, 926, 930 each comprise solid precursors corresponding to certain materials of layers to be formed on the gate dielectric layer 108 to form an active structure over the gate dielectric layer 108.

For example, in some embodiments, the active structure to be formed on the gate dielectric layer 108 comprises a combination of first, second, and third materials. In some embodiments, the first solid precursor 922 corresponds to the first material; the second solid precursor 926 corresponds to the second material; and the third solid precursor 930 corresponds to the third material. In other embodiments, the first solid precursor 922 may correspond to a mixture of solid precursors corresponding to the first and second materials; the second solid precursor 926 may correspond to the first material; and the third solid precursor 930 may correspond to the third material. In yet other embodiments, the first solid precursor 922 may correspond to a mixture of solid precursors corresponding to the first, second, and third materials; and the second solid precursor 926 may correspond to the first material; and the third solid precursor 930 may be omitted. In yet other embodiments, more than the three precursor vessels may be coupled to the chamber housing 902.

Figure 10A:
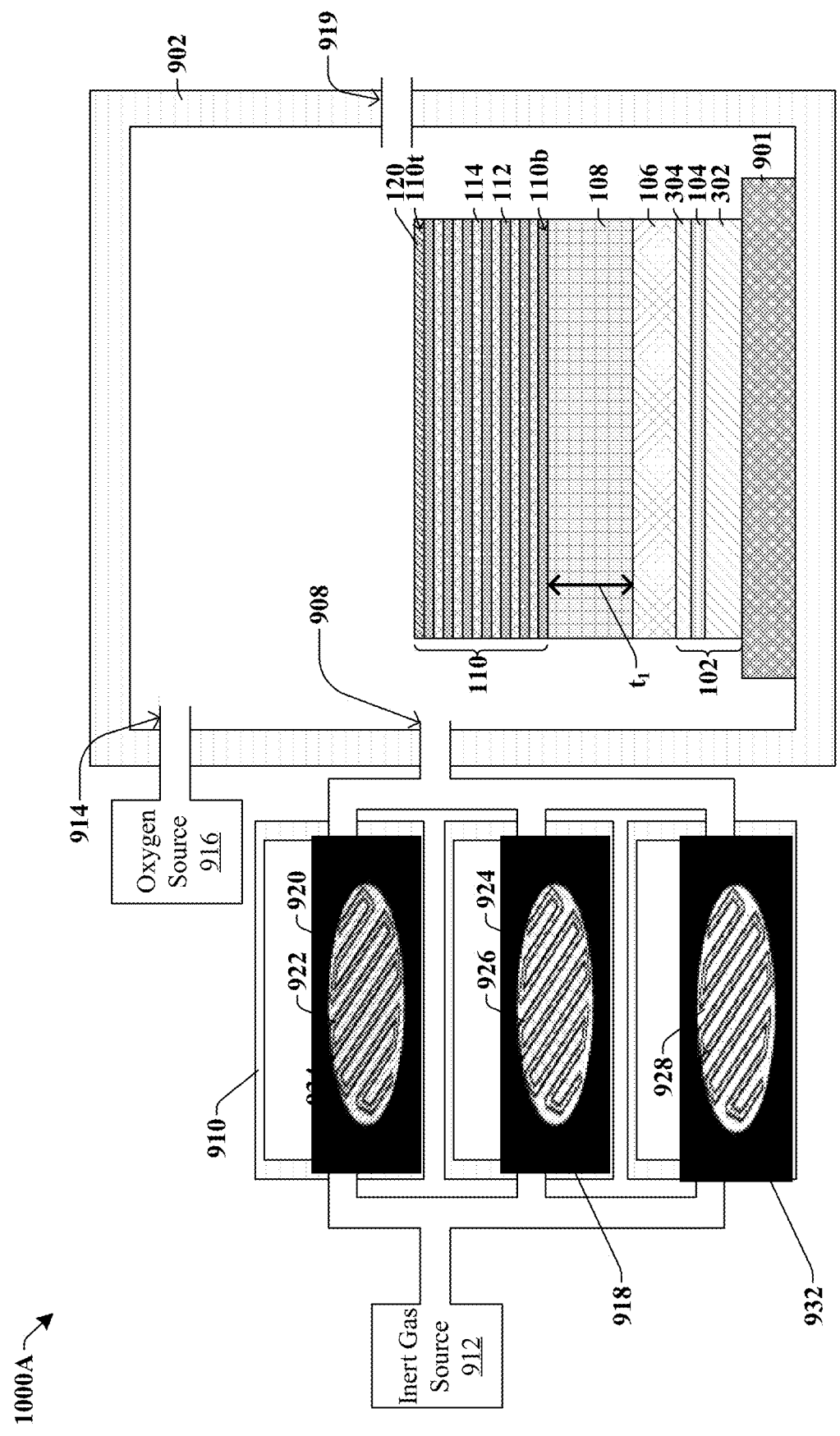
Figure 10B:
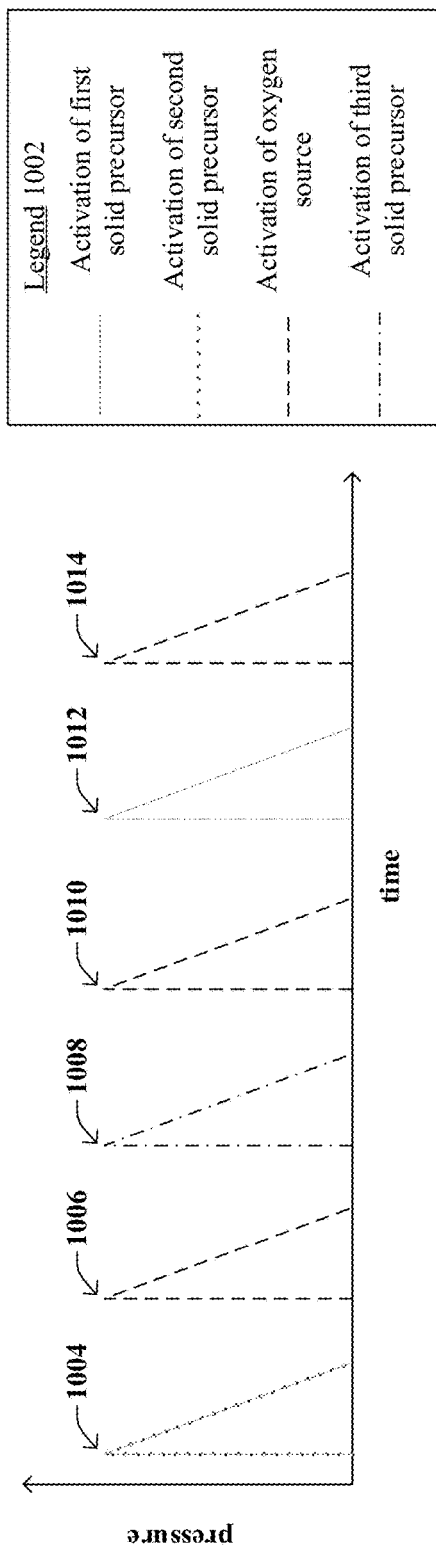
Figure 10C:
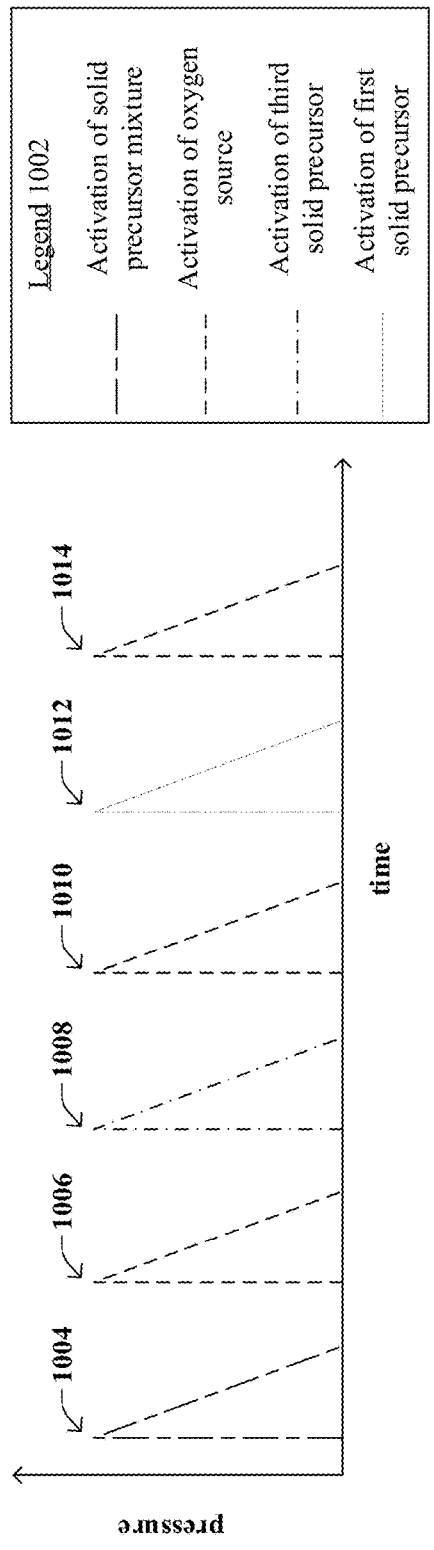
Figure 11A:
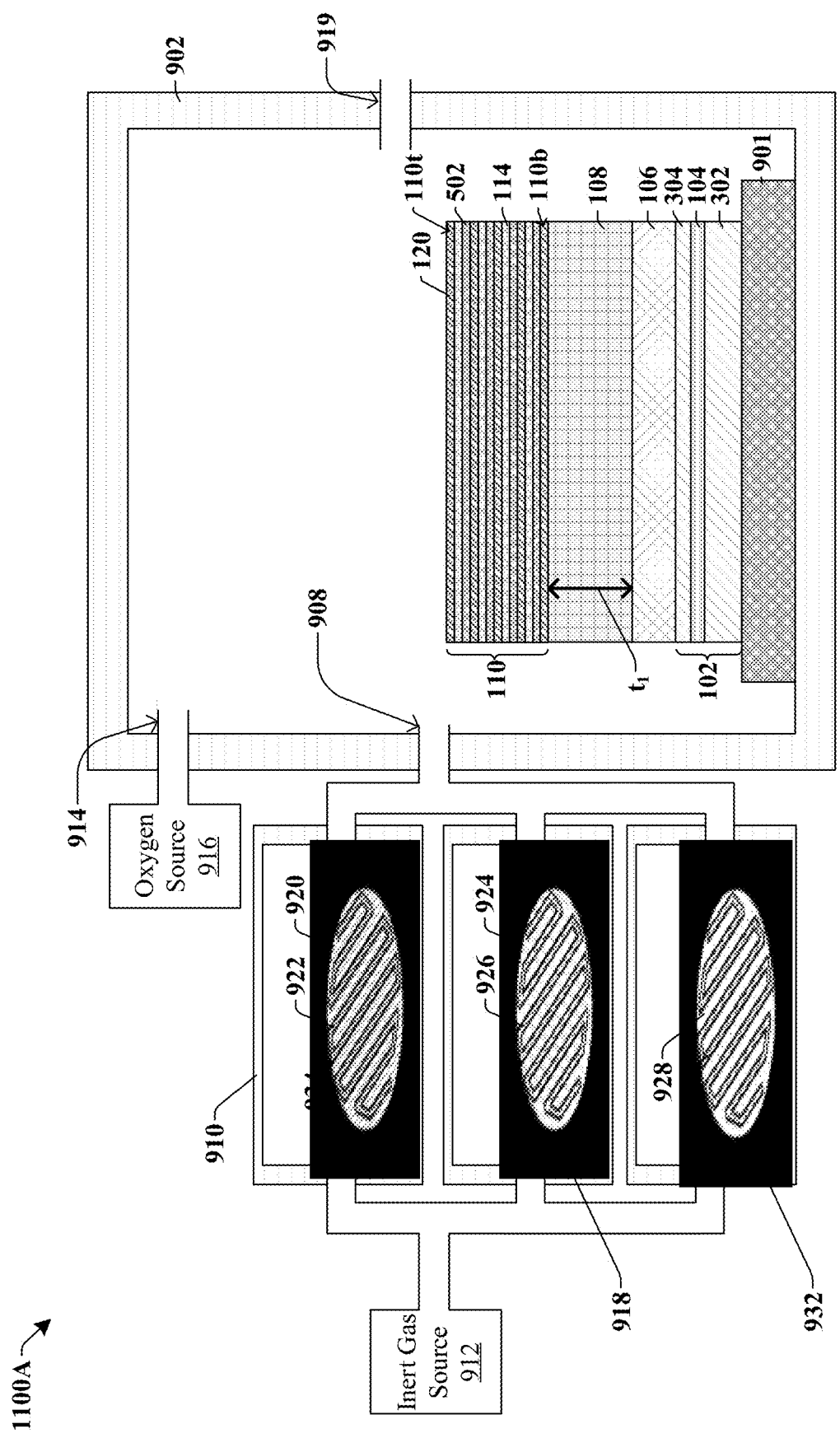
Figure 11B:
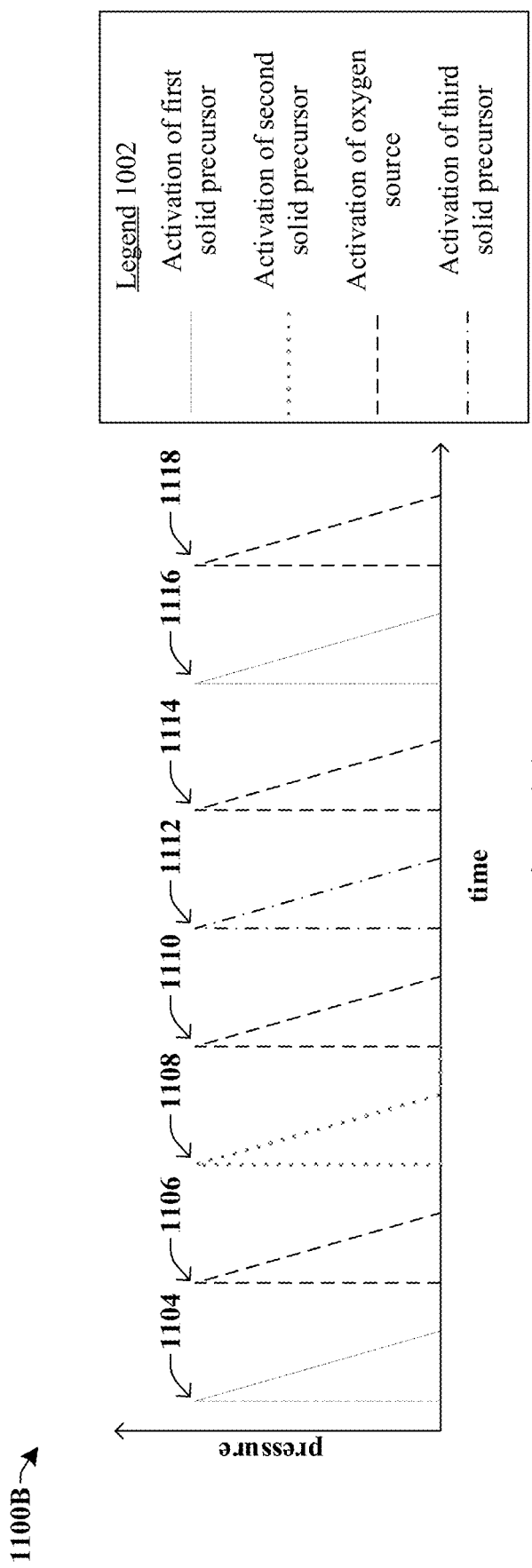

It will be appreciated that various methods may be used to form the active structure over the gate dielectric layer 108, and each method may utilize different combinations of solid precursors in the precursor vessels. FIGS. 10A-10C will correspond to first and second methods of forming the active structure over the gate dielectric layer 108; FIGS. 11A and 11B will correspond to a third method of forming the active structure over the gate dielectric layer 108; and FIGS. 12A and 12B will correspond to a fourth method of forming the active structure over the gate dielectric layer 108. Thus, the method may proceed from FIG. 9 to FIGS. 10A and 10B; from FIG. 9 to FIGS. 10A and 10C, thereby skipping FIG. 10B; from FIG. 9 to FIGS. 11A and 11B, thereby skipping FIGS. 10A-10C; or from FIG. 9 to FIGS. 12A and 12B, thereby skipping FIGS. 10A-11B.

Further, the methods in FIGS. 10A-12B illustrate methods of forming the active structure over the gate dielectric layer 108 by atomic layer deposition (ALD). However, it will be appreciated that in other embodiments, the active structure may be formed over the gate dielectric layer 108 by other deposition methods such as, for example, CVD, PVD, or the like.

As shown in cross-sectional view 1000A of FIG. 10A, in some embodiments, an atomic layer deposition process is performed to form an active structure 110 over the gate dielectric layer 108, wherein the active structure 110 comprises a stack of cocktail layers 112 comprising a mixture of first and second materials and first active layers 114 comprising a third material. In some such embodiments, a bottommost layer 110b of the active structure 110 comprises one of the cocktail layers 112. Further, in some embodiments, a topmost layer 110t of the active structure 110 comprises a second active layer 120 comprising the first material, but not the second or third materials.

In some such embodiments, the first, second, and third materials of the active structure 110 are metal oxides. In some such embodiments, the first, second, and third solid precursors 922, 926, 930 may comprise a first metal, a second metal, and a third metal, respectively, corresponding to the first, second, and third materials of the active structure 110. For example, in some embodiments, the first material may comprise gallium, hafnium, zirconium, titanium, aluminum, tantalum, strontium, barium, scandium, magnesium, lanthanum, gadolinium, or some other suitable metal. In some embodiments, wherein the first material comprises gallium, the first precursor of the first solid precursor 922 may comprise, for example, $Ga(C_2H_5)_3$, $Ga(NMe)_3$, $Ga(C_5H_7O_2)_3$, GaCp*, $Ga(CH_3)_3$, $Ga_2(NMe_2)_6$, or some other suitable solid precursor comprising gallium.

In some embodiments, the second material comprises indium, tin, zinc, arsenic, or some other suitable metal. In some such embodiments, wherein the second material comprises indium, the second solid precursor 926 may comprise, for example, trimethyl-indium, triethyl-indium, InCp ($C_5H_5In$), InCA-1($C_8H_{24}InNSi_2$), DADI($C_7H_{18}InN$), or some other suitable solid precursor comprising indium. In some other embodiments, the third material comprises zinc or some other metal. In some embodiments, the third solid precursor 930 comprises, for example, $Zn(CH_3COO)_2$, diethylzinc, dimethylzinc, zinc acetate, $(CH_3)Zn(OCH(CH_3)_2)$, or some other suitable solid precursor.

FIG. 10B illustrates a timing diagram 1000B of some embodiments of a first method of forming the active structure 110 over the gate dielectric layer 108, wherein the first solid precursor 922 corresponds to a first material; the second solid precursor 926 corresponds to a second material; and the third solid precursor 930 corresponds to a third material. FIG. 10B will be described in conjunction with the cross-sectional view 1000A of FIG. 10A.

In some embodiments, to form the active structure 110, first, a cocktail layer 112 is formed over the gate dielectric layer 108. In some such embodiments, the cocktail layer 112 comprises a mixture of the first and second materials. Thus, in some embodiments, step one 1004 of the method first comprises, according to the legend 1002 of FIG. 10B and the timing diagram 1000B of FIG. 10B, activating the first solid precursor 922 and the second solid precursor 926 at the same time. In some embodiments, the first and second solid precursors 922, 926 are activated by turning the inert gas source 912 "ON." Further, in some embodiments, the door structures 936 on the first and second vessel housings 910, 918 are "open" while the door structures 936 on the third vessel housing 932 are "closed" such that the inert gas from the inert gas source 912 enters and activates the first and second solid precursors 922, 926, and not the third solid precursor 930. In some embodiments, the inert gas source 912 comprises, for example, nitrogen gas, argon gas, hydrogen gas, a combination thereof, or some other suitable gas.

Further, in some embodiments, after the inert gas source 912 activates the first and second solid precursors 922, 926, the oxygen source 916 is turned "ON" in step two 1006 of the method such that an oxygen vapor is introduced into the reaction chamber. In some embodiments, the oxygen source 916 may comprise water. In some such embodiments, the oxygen vapor from the oxygen source 916 reacts with a precursor mixture vapor from the first and second solid precursors 922, 926 in the reaction chamber to form the cocktail layer 112 on the gate dielectric layer 108 by ALD. In some such embodiments, the cocktail layer 112 comprises a mixture of first and second materials that are metal oxides.

In some embodiments, the third solid precursor 930 is then activated in step three 1008 of the method by closing the door structures 936 to the first and second vessel housings 910, 918, opening the door structures 936 of the third vessel housing 932, and turning "ON" the inert gas source 912. In some such embodiments, the inert gas from the inert gas source 912 reacts with the third solid precursor 930 and a precursor vapor enters the reaction chamber. Then, in step four 1010 of the method turns the oxygen source 916 "ON" such that oxygen vapor is introduced into the reaction chamber. In some such embodiments, the oxygen vapor reacts with the precursor vapor from the third solid precursor 930 to form a first active layer 114 over the cocktail layer 112 by ALD. In some embodiments, steps one through four 1004, 1006, 1008, 1010 are repeated multiple times to form a stack of cocktail layers 112 and first active layers 114 over the gate dielectric layer 108.

In some embodiments, a topmost layer 110t of the active structure 110 comprises a second active layer 120 made up of the first material and not the second or third materials. Thus, in some embodiments, the method of FIG. 10B proceeds with step five 1012, wherein the door structures 936 of the second and third vessel housings 918, 932 are closed, the door structures 936 of the first vessel housing 910 are opened, and the inert gas source 912 is turned "ON" to activate the first solid precursor 922. Further, in step six 1014 of the method, the oxygen source 916 "ON" such that oxygen vapor is introduced into the reaction chamber. In some such embodiments, the oxygen vapor reacts with the precursor vapor from the first solid precursor 922 to form the second active layer 120 over the cocktail layers 112 and first active layers 114 by ALD.

In some embodiments, byproducts of the reactions between the precursor vapors and the oxygen vapor may exit the reaction chamber through the gas outlet line 919. In some embodiments, the gas pulses of steps one through six 1004, 1006, 1008, 1010, 1012, 1014 may each have a time period in a range of between, for example, approximately 1 millisecond to approximately 20 minutes. Further, in some embodiments, the gas pulses of steps one through six 1004, 1006, 1008, 1010, 1012, 1014 do not overlap with one another, besides the activation of the first and second solid precursors 922, 926 in step one 1004. In some other embodiments, the gas pulses of steps one through six 1004, 1006, 1008, 1010, 1012, 1014 may partially overlap with one another. For example, in some other embodiments, step two 1006 may begin before the inert gas source 912 used in step one 1004 is completely turned "OFF."

Because the first material of the cocktail layer 112 has a stronger bonding energy, less defects (e.g., oxygen vacancies) and thus, less surface states (i.e., excess charges) are present at an interface between the first material of the cocktail layer 112 and the gate dielectric layer 108. In some embodiments, the second material of the cocktail layer 112 has a higher mobility than the first material of the cocktail layer 112 due to a weaker bond energy and an increase in metal ions in the second material. Thus, mobile charge carriers may have a higher mobility at an interface between the second material of the cocktail layer 112 and the gate dielectric layer 108. Therefore, the bottommost layer 110b of the active structure 110 comprises the cocktail layer 112 which includes a mixture of the first and second materials to reduce defects but also increase charge mobility at an interface between the bottommost layer 110b of the active structure 110 and the gate dielectric layer 108.

Further, the second active layer 120 comprises the first material which has a higher bonding energy than the second and third materials. By forming the second active layer 120 as the topmost layer 110t of the active structure 110, defects (e.g., surface states, oxygen vacancies) at a topmost surface of the active structure 110 are reduced.

FIG. 10C illustrates a timing diagram 1000C of some embodiments of a second method of forming the active structure 110 over the gate dielectric layer 108, wherein the first solid precursor 922 corresponds to a precursor mixture of the first and second materials; the second solid precursor 926 corresponds to a first material; and the third solid precursor 930 corresponds to a third material. FIG. 10C will be described in conjunction with the cross-sectional view 1000A of FIG. 10A.

In some other embodiments, the first solid precursor 922 corresponds to a mixture of precursors corresponding to the first and second materials of the cocktail layer 112. In some embodiments, a ratio of a first precursor corresponding to the first material to a second precursor corresponding to the second material is in a range of between, for example, approximately 0.01 and approximately 0.99. Thus, in some embodiments, step one 1004 of the method comprises activating the solid precursor mixture in the first vessel housing 910 by opening the door structures 936 of the first vessel housing 910, closing the door structures 936 of the second and third vessel housings 918, 932, and turning "ON" the inert gas source 912. Then, the inert gas of the inert gas source 912 reacts with the solid precursor mixture such that a precursor mixture vapor enters the reaction chamber. In some embodiments, the method of FIG. 10C proceeds with step two 1006, wherein the oxygen source 916 is turned "ON" such that an oxygen vapor reacts with the precursor mixture vapor in the reaction chamber to form the cocktail layer 112 on the gate dielectric layer 108 by ALD.

In some embodiments, steps three through six 1008, 1010, 1012, 1014 comprise the same or similar steps as described with respect to the method of FIG. 10B.

As shown in cross-sectional view 1100A of FIG. 11A, in some other embodiments, the active structure 110 formed over the gate dielectric layer 108 comprises a stack of first active layers 114 comprising the third material, second active layers 120 comprising the first material, and third active layers 502 comprising the second material. In some such embodiments, the bottommost layer 110b of the active structure 110 may comprise one of the first, second, or third active layers 114, 120, 502. In some embodiments, the topmost layer 110t of the active structure 110 comprises one of the second active layers 120 comprising the first material.

FIG. 11B illustrates a timing diagram 1100B of some embodiments of a third method of forming the active structure 110 over the gate dielectric layer 108 as shown in cross-sectional view 1100A of FIG. 11A, wherein the first solid precursor 922 in the first precursor vessel may correspond to the first material; the second solid precursor 926 in the second precursor vessel may correspond to the second material; and the third solid precursor 930 may correspond to the third material. FIG. 11B will be described in conjunction with the cross-sectional view 1100A of FIG. 11A.

As shown in the timing diagram 1100B, in some embodiments, step one 1104 of the method includes turning "ON" the inert gas source 912 to activate the first solid precursor 922 associated with the first material of one of the second active layers 120. In some embodiments, step two 1106 of the method comprises turning on the oxygen source 916 such that an oxygen vapor reacts with a first precursor vapor from step one 1104 to form one of the second active layers 120 over the gate dielectric layer 108 by ALD. In some embodiments, the method proceeds with step three 1108, wherein the inert gas source 912 is turned on to activate the second solid precursor 926 associated with one of the third active layers 502. In some embodiments, step four 1110 of the method comprises turning on the oxygen source 916 such that an oxygen vapor reacts with a second precursor vapor from step three 1108 to form one of the third active layers 502 over one of the second active layers 120 by ALD.

In some embodiments, the method proceeds with step five 1112, wherein the inert gas source 912 is turned "ON" to active the third solid precursor 930 associated with the third material of one of the first active layers 114. In some embodiments, step six 1114 of the method comprises turning on the oxygen source 916 such that an oxygen vapor reacts with a third precursor vapor from step five 1112 to form one of the first active layers 114 over one of the third active layers 502 by ALD. In some embodiments, steps one through six 1104, 1106, 1108, 1110, 1112 are repeated to form a stack of first, second, and third active layers 114, 120, 502 over the gate dielectric layer 108. Then, in some embodiments, the method of FIG. 11B comprises steps seven 1116 and eight 1118 to form the topmost layer 110t of the active structure 110 comprising the second active layer 120. Thus, in some embodiments, steps seven 1116 and eight 1118 comprise the same or similar steps as steps one 1104 and two 1106 to form a second active layer 120.

Figure 12A:
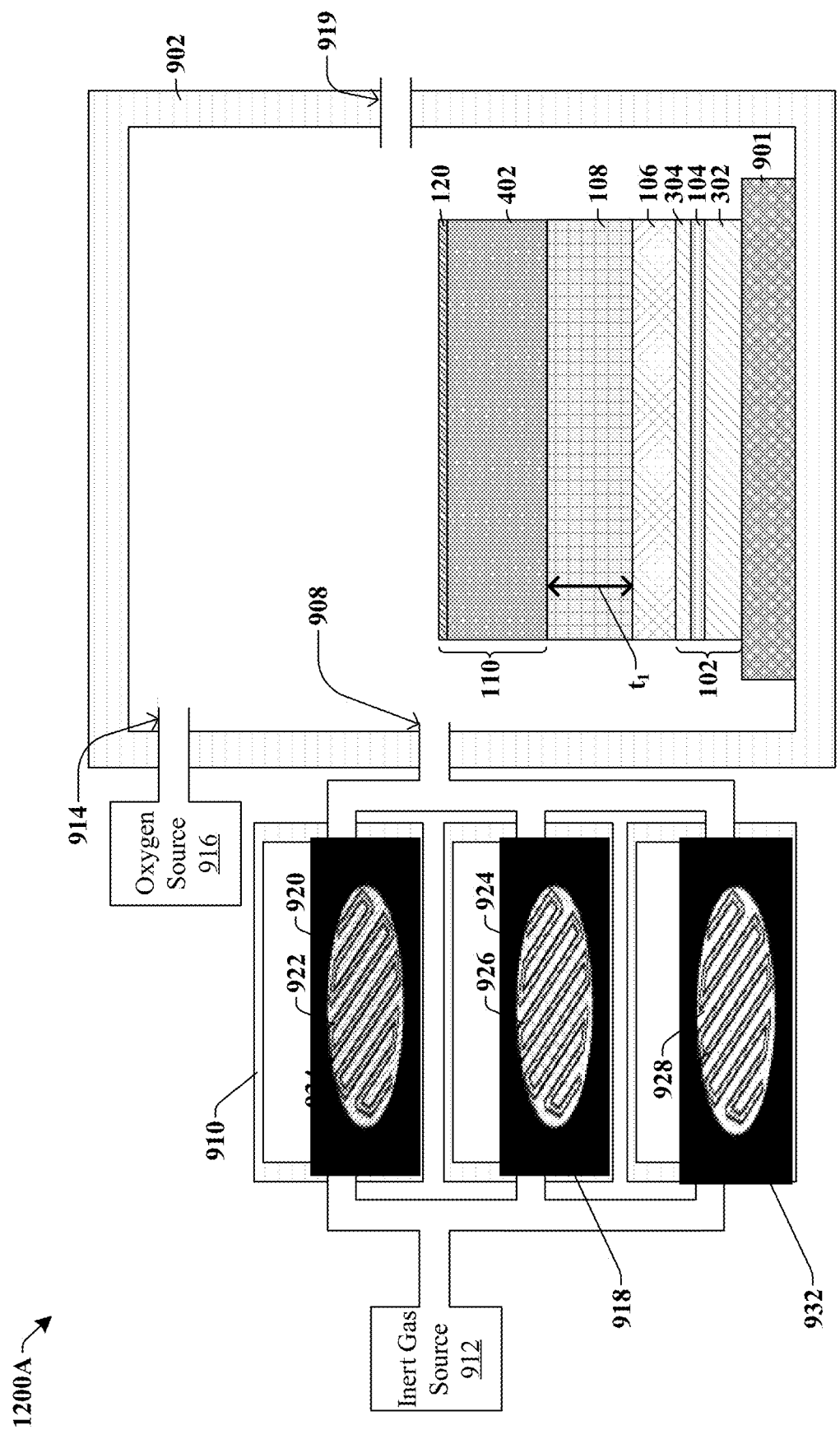

As shown in cross-sectional view 1200A of FIG. 12A, in some other embodiments, the active structure 110 formed over the gate dielectric layer 108 comprises a lower portion 402 that includes a mixture of the first, second, and third materials over the gate dielectric layer 108. Thus, in some embodiments, the active structure 110 comprises a lower portion 402 that does not have defined layers. Further, in some such other embodiments, a second active layer 120 comprising the first material is formed over the lower portion 402 such that the active structure 110 comprises the second active layer 120 arranged over the lower portion 402.

Figure 12B:
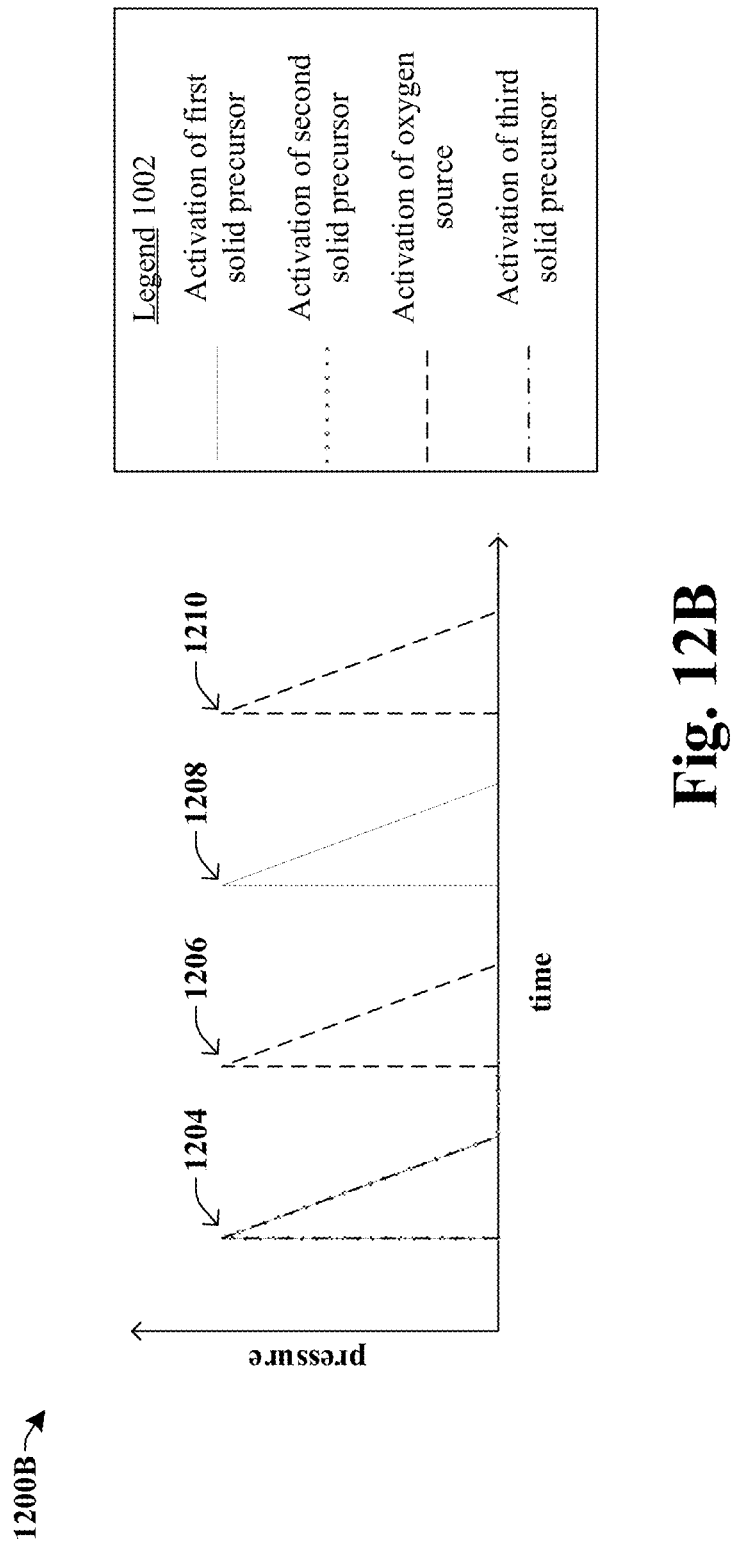

FIG. 12B illustrates a timing diagram 1200B of some embodiments of a fourth method of forming the active structure 110 over the gate dielectric layer 108 as shown in cross-sectional view 1200A of FIG. 12A, wherein the first solid precursor 922 in the first precursor vessel may correspond to the first material; the second solid precursor 926 in the second precursor vessel may correspond to the second material; and the third solid precursor 930 may correspond to the third material. FIG. 12B will be described in conjunction with the cross-sectional view 1200A of FIG. 12A.

As shown in the timing diagram 1200B of FIG. 12B, in some embodiments, step one 1204 of the method includes activating the first, second, and third solid precursors 922, 926, 930 at a same time by turning the inert gas source 912 "ON." Then, in step two 1206 of the method, the oxygen source 916 is turned "ON" such that an oxygen vapor reacts with a precursor mixture vapor from step one 1204 to form the lower portion 402 of the active structure 110 by ALD. In some embodiments, steps one 1204 and two 1206 are repeated many times to increase a thickness of the lower portion 402. In some embodiments, after the formation of the lower portion 402 of the active structure, the method proceeds with step three 1208, wherein the inert gas source is turned "ON" to activate the first solid precursor 922, but not the second or third solid precursors 926, 930. Further, in some embodiments, the method proceeds with step four 1210, wherein the oxygen source 916 is turned "ON" such that an oxygen vapor reacts with a second mixture vapor from step three 1208 to form the second active layer 120 over the lower portion 402 of the active structure 110.

Therefore, FIGS. 10A-12B illustrate a variety of methods that may be used to form the active structure 110 over the gate dielectric layer 108. It will be appreciated that other related methods and/or combination of the methods of FIGS. 10A-12B are also within the scope of this disclosure.

In some embodiments, the method proceeds with forming a capping structure over the active structure. FIGS. 13-16 illustrate a first method of forming a capping structure over the active structure 110, whereas FIGS. 17-20 illustrates a second method of forming a capping structure over the active structure 110. Thus, in some embodiments, after forming the active structure 110 over the gate dielectric layer 108, the method may proceed to FIG. 13 or to FIG. 17, thereby skipping the steps in FIGS. 13-16.

Figure 13:
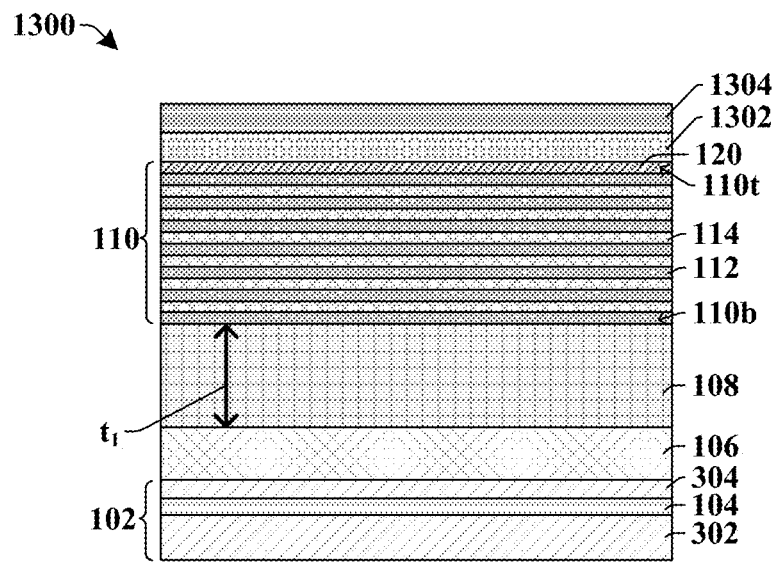

As shown in cross-sectional view 1300 of FIG. 13, in some embodiments, a first continuous metal layer 1302 is formed over the active structure 110. In some embodiments, the first continuous metal layer 1302 comprises a first metal material that has a higher affinity for oxygen than the metals in the active structure 110. Thus, in some embodiments, the first metal material is different than metals in the active structure 110. In some embodiments, the first continuous metal layer 1302 may comprise, for example, aluminum, calcium, scandium, yttrium, niobium, tantalum, chromium, iron, titanium, silicon, hafnium, zirconium, titanium, strontium, barium, magnesium, lanthanum, gadolinium, a combination thereof, and/or some other suitable metal or semiconductor material with a strong oxidation ability (i.e., a high affinity for oxygen). In some embodiments, the first continuous metal layer 1302 is formed using an atomic layer deposition (ALD) process, and thus, may be formed within a same ALD reaction chamber used for forming the active structure 110. For example, in some embodiments, the first continuous metal layer 1302 may be formed using an ALD process by activating a precursor associated with the first metal material by turning "ON" an inert gas source (e.g., 912 of FIG. 9). In other embodiments, the first continuous metal layer 1302 may be formed using a different deposition process than ALD, such as, for example, PVD, CVD, sputtering, or some other suitable process.

In some embodiments, when an ALD process is used to form the first continuous metal layer 1302, if the first continuous metal layer 1302 comprises aluminum, the precursor used may comprise, for example, $Al(CH_3)_3$ or some other precursor comprising aluminum. In some embodiments, when an ALD process is used to form the first continuous metal layer 1302, if the first continuous metal layer 1302 comprises calcium, the precursor used may comprise, for example, $Ca(OCC(CH_3)_3CHCOC(CH_3)_3))_2$, calcium bis (2, 2, 6, 6-tetramethyl-3, 5-heptanedionate), or some other precursor comprising calcium.

In some embodiments, a second continuous metal layer 1304 is then formed over the first continuous metal layer 1302. In some embodiments, the second continuous metal layer 1304 may comprise a same or different material than the first continuous metal layer 1302. In other embodiments, the second continuous metal layer 1304 is omitted. In some embodiments, the second continuous metal layer 1304 is formed using a same deposition process as the first continuous metal layer 1302 such as ALD, PVD, CVD, sputtering, or the like. In some embodiments, the second continuous metal layer 1304 may be formed using an ALD process by activating a precursor associated with the second metal material by turning "ON" an inert gas source (e.g., 912 of FIG. 9). In some embodiments, a thickness of the first and second continuous metal layers 1302, 1304 may be in a range of between, for example, approximately 0.1 angstroms to approximately 30 angstroms.

Figure 14:
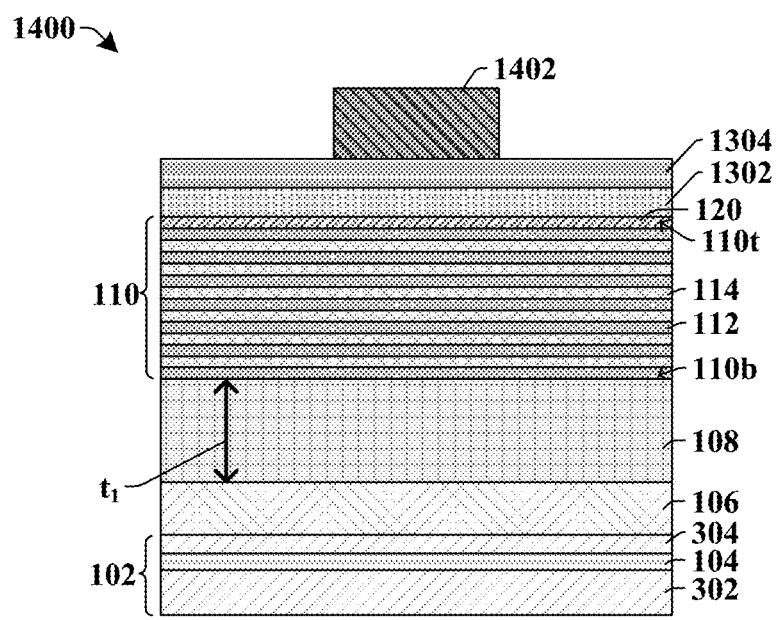

As shown in cross-sectional view 1400 of FIG. 14, in some embodiments, a masking structure 1402 is formed over the first and second continuous metal layers 1302, 1304. In some embodiments, the masking structure 1402 is formed using photolithography and removal (e.g., etching) processes. In some embodiments, the masking structure 1402 comprises a photoresist material or a hard mask material.

Figure 15:
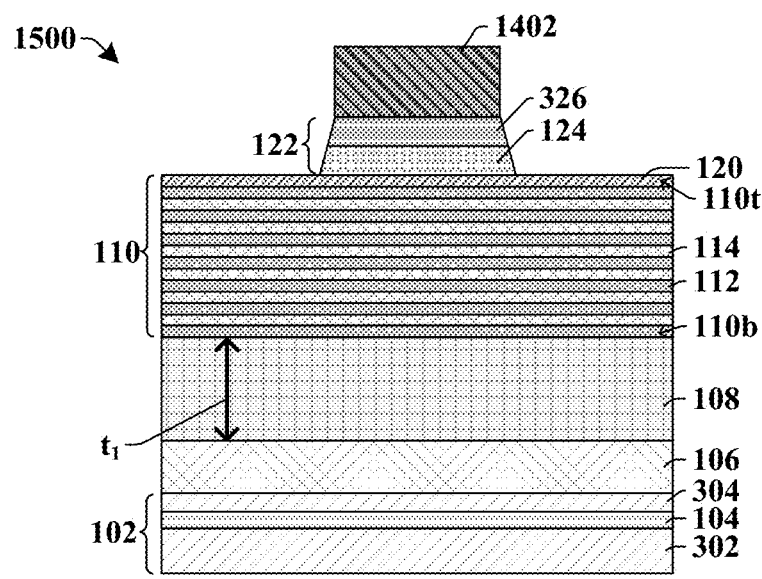

As shown in cross-sectional view 1500 of FIG. 15, in some embodiments, a removal process is performed according to the masking structure 1402 to remove peripheral portions of the first and second continuous metal layers (1302, 1304 of FIG. 14) to form a capping structure 122 over the active structure 110 that comprises a first metal layer 124 and a second metal layer 326 arranged over the first metal layer 124. In some embodiments, the removal process of FIG. 15 comprises a wet or dry etching process. In some embodiments, an upper surface of the second metal layer 326 is narrower than a lower surface of the first metal layer 124 as a residual effect from the removal process of FIG. 15.

Figure 16:
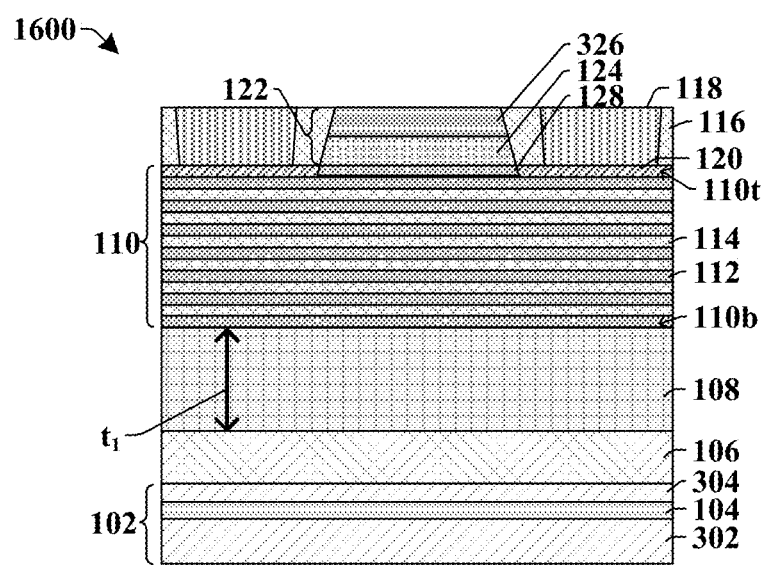

As shown in cross-sectional view 1600 of FIG. 16, in some embodiments, a thermal annealing process is performed. In some embodiments, the thermal annealing process is performed in a chamber at a temperature in a range of between, for example, approximately 400 degrees Celsius and approximately 700 degrees Celsius. In some embodiments, after the thermal annealing process, a diffusion region 128 is formed within the topmost layer 110t of the active structure 110. In some embodiments, the diffusion region 128 comprises a metal oxide made up of the first metal material of the capping structure 122 and oxygen. In some such embodiments, the first metal material may diffuse into the active layer during the thermal annealing process and bond with loosely bonded oxygen in the active structure 110 because the first metal material has a higher affinity for oxygen than metals in the active structure 110. Thus, the capping structure 122 aids in reducing defects (e.g., oxygen vacancies, surface states, weakly bonded oxygen) in the active structure 110 to improve performance of the FET FeRAM device.

In some embodiments, after the thermal annealing process, source/drain contacts 118 are formed over the active structure 110 and on either side of the capping structure 122. In some embodiments, the source/drain contacts 118 are formed within an interconnect dielectric layer 116 arranged over the active structure 110 through various steps comprising deposition processes (e.g., PVD, CVD, ALD, sputtering, etc.) removal processes (e.g., wet etching, dry etching, chemical mechanical planarization (CMP), etc.), and/or patterning processes (e.g., photolithography/etching). In some other embodiments, the source/drain contacts 118 are formed first, and then the interconnect dielectric layer 116 is formed between the source/drain contacts 118 and over the active structure 110.

In some embodiments, the interconnect dielectric layer 116 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the source/drain contacts 118 comprise, for example, aluminum, tungsten, copper, tantalum, titanium, or some other suitable conductive material.

Further, in some embodiments, voltage terminals are coupled to the gate electrode 106 and the source/drain contacts 118. In some embodiments, the capping structure 122 is grounded. In other embodiments, the capping structure 122 is not grounded or coupled to any voltage terminal. Nevertheless, in some embodiments, the overall structure formed in FIG. 16 is a thin film transistor (TFT) that is also a field effect transistor (FET) ferroelectric random access memory (FeRAM) device. In some such embodiments, when sufficient signals (e.g., current, voltage) are applied to the source/drain contacts 118 and the gate electrode 106, channel regions may be formed in the active structure 110 to read memory from or write memory to the gate dielectric layer 108. In some embodiments, the capping structure 122 arranged over the active structure 110 and the cocktail layer 112 arranged directly on the gate dielectric layer 108 aid in reducing defects (e.g., surface states, oxygen vacancies, weakly bonded oxygen) in the active structure 110 and thus, the channel regions to increase switching speeds and reliability of the overall FET FeRAM device.

FIGS. 17-20 illustrate cross-sectional views 1700-2000 of some alternative steps for forming the capping structure 122 over the active structure 110.

Figure 17:
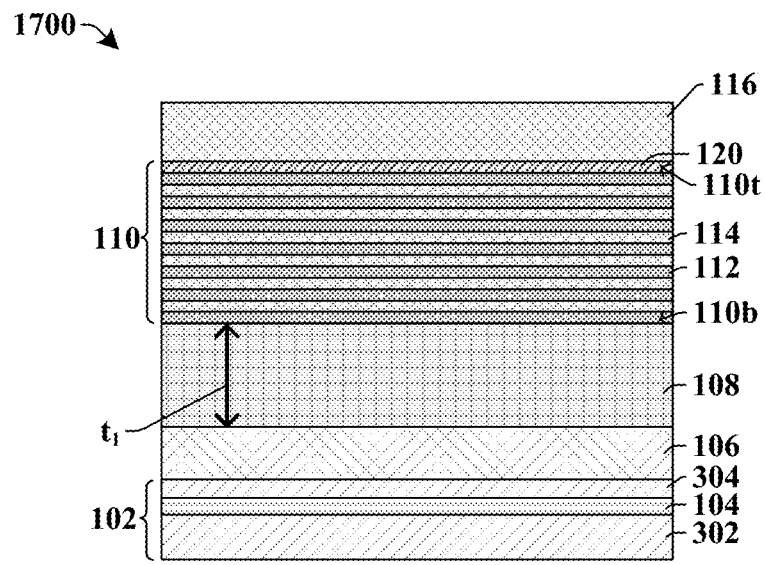

As shown in cross-sectional view 1700 of FIG. 17, in some embodiments, the interconnect dielectric layer 116 is first formed over the active structure 110.

Figure 18:
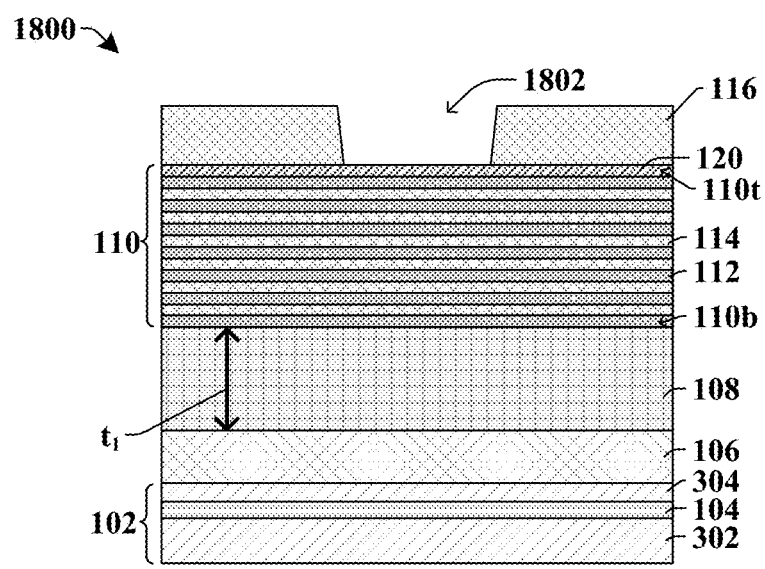

As shown in cross-sectional view 1800 of FIG. 18, in some embodiments, the interconnect dielectric layer 116 is patterned to form an opening 1802 within the interconnect dielectric layer 116 to expose the active structure 110. In some embodiments, the opening 1802 in the interconnect dielectric layer 116 is formed by various steps of deposition processes (e.g., PVD, CVD, ALD, sputtering, spin-on, etc.), patterning processes (e.g., photolithography/etching), and removal processes (e.g., wet etching, dry etching).

Figure 19:
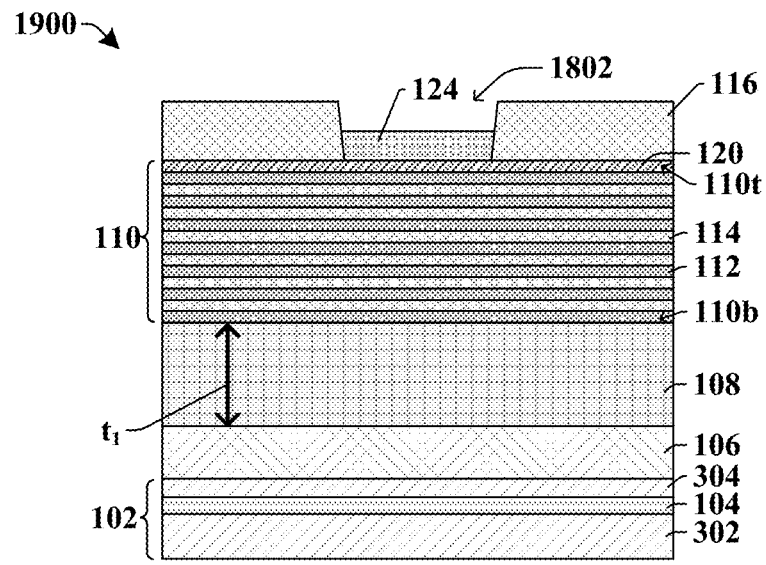

As shown in cross-sectional view 1900 of FIG. 19, in some embodiments, the first metal layer 124 is formed within the opening 1802 of the interconnect dielectric layer 116. In some embodiments, the first metal layer 124 partially fills the opening 1802, whereas in some other embodiments, the first metal layer 124 completely fills the opening 1802. In some embodiments, the first metal layer 124 is formed by a deposition process (e.g., PVD, CVD, ALD, sputtering, etc.) followed by a removal process (e.g., etching, CMP).

Figure 20:
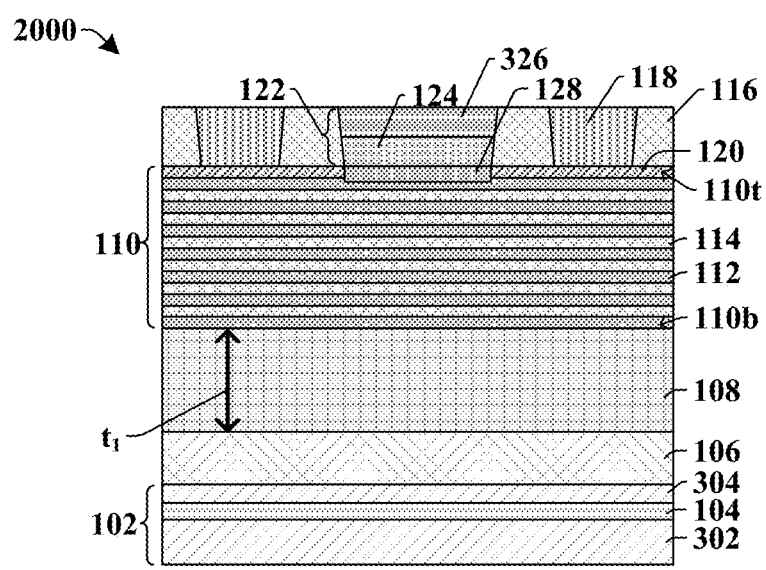

As shown in cross-sectional view 2000 of FIG. 20, in some embodiments, the second metal layer 326 is formed over the first metal layer 124 within the opening (1802 of FIG. 19) to form the capping structure 122 over the active structure 110. In some embodiments, the thermal annealing process is performed to form the diffusion region 128 of the active structure 110. Then, in some embodiments, the source/drain contacts 118 are formed within the interconnect dielectric layer 116.

In some other embodiments, prior to forming the second metal layer 326 over the first metal layer 124, the interconnect dielectric layer 116 is patterned to form openings for the source/drain contacts 118. In some embodiments, the second metal material is then formed within the openings for the source/drain contacts 118 and in the opening (1802 of FIG. 19) of the interconnect dielectric layer 116 to form the source/drain contacts 118 and the second metal layer 326. In such embodiments, the source/drain contacts 118 and the second metal layer 326 may comprise the second metal material. Further, in some such embodiments, the thermal annealing process to form the diffusion region 128 may be performed before or after the deposition of the second metal material.

In some embodiments, because the capping structure 122 is formed within the opening (1802 of FIG. 19) of the interconnect dielectric layer 116, the capping structure 122 may have a topmost surface that is wider than a bottommost surface. Further, in some embodiments, because the capping structure 122 is formed within the opening (1802 of FIG. 19), less damage from removal processes may occur to the topmost layer 110t of the active structure 110 compared to other embodiments, wherein the first metal layer 124 is formed prior to forming the interconnect dielectric layer 116 as illustrated in, for example, FIGS. 13-16.

Nevertheless, in some embodiments, the capping structure 122 aids in reducing defects (e.g., surface states, oxygen vacancies, weakly bonded oxygen) in the active structure 110 to improve switching speeds and reliability of the overall FET FeRAM device.

Figure 21:
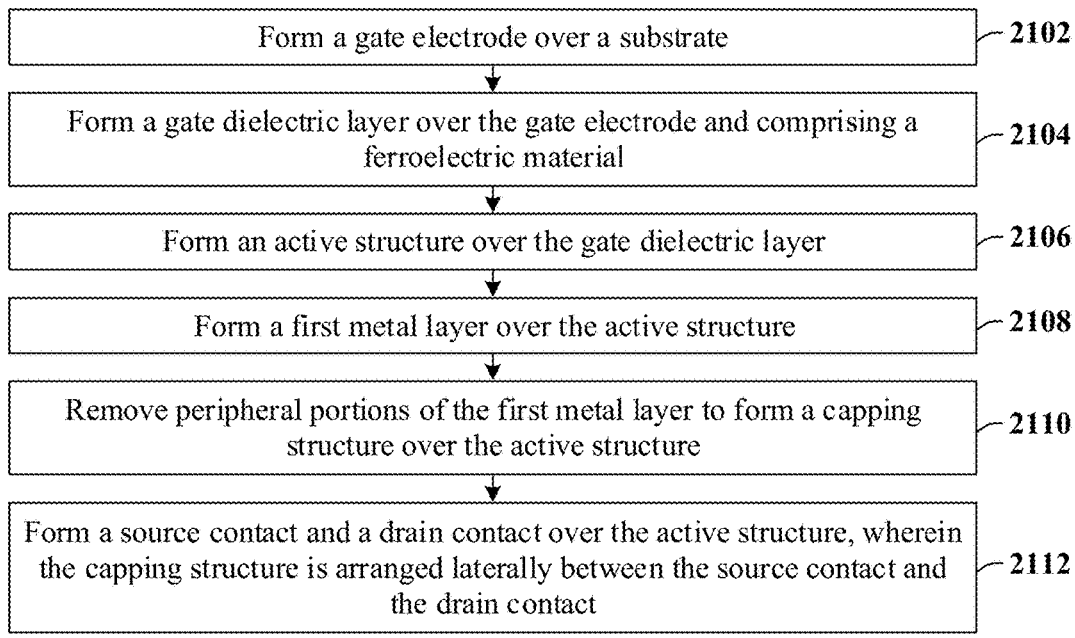
FIG. 21 illustrates a flow diagram of some embodiments of a method of forming a capping structure over an active structure of a FET FeRAM device that corresponds to the methods of FIGS. 6-20.

FIG. 21 illustrates a flow diagram of some embodiments of a method 2100 of forming a FET FeRAM device comprising a capping structure arranged over an active structure to reduce defects in the active structure and increase switching speeds and reliability of the overall FET FeRAM device.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a gate electrode is formed over a substrate. FIG. 7 illustrates a cross-sectional view 700 of some embodiments corresponding to act 2102.

At act 2104, a gate dielectric layer is formed over the gate electrode and comprises a ferroelectric material. FIG. 8 illustrates a cross-sectional view 800 of some embodiments corresponding to act 2104.

At act 2106, an active structure is formed over the gate dielectric layer. FIG. 10A illustrates a cross-sectional view 1000A of some embodiments corresponding to act 2106.

At act 2108, a first metal layer is formed over the active structure. FIG. 13 illustrates a cross-sectional view 1300 of some embodiments corresponding to act 2108.

At act 2110, peripheral portions of the first metal layer are removed to form a capping structure over the active structure. FIG. 15 illustrates a cross-sectional view 1500 of some embodiments corresponding to act 2110.

At act 2112, a source contact and a drain contact are formed over the active structure, wherein the capping structure is arranged laterally between the source contact and the drain contact. FIG. 16 illustrates a cross-sectional view 1600 of some embodiments corresponding to act 2112.

Therefore, the present disclosure relates to a method of forming an active structure over a ferroelectric layer and a capping structure over the active structure to reduce defects and optimize charge mobility in the active structure to increase switching speeds and reliability of the overall FET FeRAM device.

Accordingly, in some embodiments, the present disclosure relates to an integrated chip, comprising: a gate electrode arranged over a substrate; a gate dielectric layer arranged over the gate electrode comprising a ferroelectric material; an active structure arranged over the gate dielectric layer and comprising a semiconductor material; a source contact and a drain contact arranged over the active structure; and a capping structure arranged over the active structure and between the source contact and the drain contact, wherein the capping structure comprises a first metal material.

In other embodiments, the present disclosure relates to an integrated chip comprising: a gate electrode arranged over a substrate; a gate dielectric layer arranged over the gate electrode, wherein the gate dielectric layer comprises a ferroelectric material; an active structure arranged over the gate dielectric layer; a source contact and a drain contact arranged over the active structure; and a capping structure arranged over the active structure and between the source contact and the drain contact, wherein the capping structure comprises a first metal material that has a higher affinity for oxygen than metals in the active structure.

In yet other embodiments, the present disclosure relates to a method comprising: forming a gate electrode over a substrate; forming a gate dielectric layer comprising a ferroelectric material over the gate electrode; forming an active structure over the gate dielectric layer; forming a first metal layer over the active structure; removing peripheral portions of the first metal layer to form a capping structure over the active structure; and forming a source contact and a drain contact over the active structure, wherein the capping structure is arranged laterally between the source contact and the drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a gate electrode arranged over a substrate;
a gate dielectric layer arranged over the gate electrode and comprising a ferroelectric material;
an active structure arranged over the gate dielectric layer and comprising a semiconductor material;
a source contact and a drain contact arranged over the active structure; and
a capping structure arranged over the active structure and between the source contact and the drain contact, wherein the capping structure comprises a first layer comprising a first metal material and a second layer arranged over the first layer and comprising a second metal material.

2. The integrated chip according to claim 1, wherein the active structure comprises a diffusion region directly under the capping structure, and wherein the diffusion region comprises oxide of the first metal material.

3. The integrated chip according to claim 1, wherein the capping structure has a higher affinity for oxygen than the active structure.

4. The integrated chip according to claim 1, wherein the active structure comprises a plurality of cocktails layers and a plurality of first active layers alternatingly stacked, wherein the plurality of cocktail layers individually have multiple different metal oxides that are intermixed, and wherein the plurality of first active layers individually have a single metal oxide different than the multiple different metal oxides.

5. The integrated chip according to claim 4, wherein the active structure further comprises a second active layer overlying the plurality of cocktails layers and the plurality of first active layers, and wherein the second active layer has only one of the multiple different metal oxides.

6. The integrated chip according to claim 1, wherein a top surface of the active structure comprises a metal oxide, and wherein the metal oxide has a more negative bonding energy than another metal oxide of the active structure.

7. The integrated chip according to claim 6, wherein the source contact directly contacts the top surface of the active structure.

8. An integrated chip, comprising:
a gate electrode arranged over a substrate;
a gate dielectric layer arranged over the gate electrode and comprising a ferroelectric material;
an active structure arranged over the gate dielectric layer and comprising a semiconductor material;
a source contact and a drain contact arranged over the active structure; and
a capping structure arranged over the active structure and between the source contact and the drain contact;
wherein the active structure comprises a plurality of metal oxides, which includes a first metal oxide having a highest bond energy amongst the plurality of metal oxides, and further comprises a layer of the first metal oxide separating a remainder of the active structure from the capping structure.

9. The integrated chip according to claim 8, wherein the capping structure comprises a metal alloy with multiple metal elements.

10. The integrated chip according to claim 8, wherein the plurality of metal oxides comprise a second metal oxide, wherein the active structure further comprise a plurality of cocktail layers between the gate dielectric layer and the layer of the first metal oxide, and wherein the plurality of cocktail layers individually comprise a mixture of the first metal oxide and the second metal oxide in which regions of the second metal oxide are buried in a region of the first metal oxide.

11. The integrated chip according to claim 10, wherein the plurality of metal oxides comprise a third metal oxide, wherein the active structure further comprises a plurality of layers of the third metal oxide alternatingly stacked with the plurality of cocktail layers, and wherein the third metal oxide has higher crystallinity than the first and second metal oxides.

12. The integrated chip according to claim 8, wherein the capping structure directly contacts the layer of the first metal oxide.

13. The integrated chip according to claim 8, wherein a topmost surface of the capping structure is level with a topmost surface of the source contact and a topmost surface of the drain contact.

14. The integrated chip according to claim 8, wherein a bottommost surface of the source contact is level with a bottommost surface of the capping structure.

15. An integrated chip, comprising:
- a gate electrode over a substrate;
- a gate dielectric layer over the gate electrode;
- a multilayer stack over the gate dielectric layer and comprising a plurality of zinc oxide layers and a plurality of cocktails layers, wherein the cocktails layers are alternatingly stacked with the zinc oxide layers and individually comprise a mixture of gallium oxide and indium oxide;
- a source contact and a drain contact over the multilayer stack; and
- a capping structure over the multilayer stack and between the source contact and the drain contact, wherein the capping structure comprises aluminum and calcium.

16. The integrated chip according to claim 15, further comprising:
- a gallium oxide layer separating the multilayer stack from the capping structure.

17. The integrated chip according to claim 16, wherein the gallium oxide layer directly contacts the source contact and the drain contact and further directly contacts the multilayer stack at one of the zinc oxide layers.

18. The integrated chip according to claim 15, wherein the plurality of cocktails layers are amorphous.

19. The integrated chip according to claim 15, wherein the capping structure comprises a layer of calcium and a layer of aluminum that are vertically stacked.

20. The integrated chip according to claim 15, wherein the gate electrode, the gate dielectric layer, and the multilayer stack share a common width.

* * * * *